US008513666B2

(12) United States Patent
Yamazaki et al.

(10) Patent No.: US 8,513,666 B2
(45) Date of Patent: Aug. 20, 2013

(54) SEMICONDUCTOR DEVICE AND MANUFACTURING METHOD THEREOF

(75) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/225,634

(22) Filed: Sep. 6, 2011

(65) Prior Publication Data

US 2011/0317108 A1  Dec. 29, 2011

Related U.S. Application Data

(60) Continuation of application No. 11/695,159, filed on Apr. 2, 2007, now Pat. No. 8,017,456, which is a continuation of application No. 10/959,056, filed on Oct. 7, 2004, now Pat. No. 7,799,590, which is a division of application No. 09/769,765, filed on Jan. 26, 2001, now Pat. No. 6,825,488.

(30) Foreign Application Priority Data

Jan. 26, 2000  (JP) .................................. 2000-018097

(51) Int. Cl.
 *H01L 21/00* (2006.01)
(52) U.S. Cl.
 USPC ............................ 257/59; 349/106; 349/158
(58) Field of Classification Search
 USPC ................... 257/59; 349/106, 158
 See application file for complete search history.

(56) References Cited

U.S. PATENT DOCUMENTS

| 4,470,667 | A |   | 9/1984 | Okubo et al. |
| 4,960,719 | A |   | 10/1990 | Tanaka et al. |
| 5,032,531 | A |   | 7/1991 | Tsutsui et al. |
| 5,034,339 | A |   | 7/1991 | Tanaka et al. |
| 5,042,920 | A | * | 8/1991 | Yoshino et al. ............... 349/106 |
| 5,045,485 | A |   | 9/1991 | Tanaka et al. |
| 5,047,819 | A |   | 9/1991 | Tanaka et al. |
| 5,140,403 | A |   | 8/1992 | Hikichi et al. |
| 5,153,685 | A |   | 10/1992 | Murata et al. |
| 5,190,794 | A | * | 3/1993 | Yoshino et al. ............... 427/162 |
| 5,200,846 | A |   | 4/1993 | Hiroki et al. |

(Continued)

FOREIGN PATENT DOCUMENTS

| EP | 0493113 A2 | 7/1992 |
| EP | 0519692 A2 | 12/1992 |

(Continued)

OTHER PUBLICATIONS

Amendment (U.S. Appl. No. 11/460,105) dated Feb. 4, 2008.

(Continued)

*Primary Examiner* — Laura Menz
(74) *Attorney, Agent, or Firm* — Fish & Richardson P.C.

(57) ABSTRACT

The aperture ratio of a pixel of a reflecting type display device is improved without increasing the number of masks and without using a black mask. Locations for light shielding between pixels are arranged such that a pixel electrode overlaps with a portion of a gate wiring and a source wiring. In locations for shielding TFTs, a high pixel aperture ratio is realized by forming a color filter (red, or lamination of red and blue), formed on an opposing substrate.

9 Claims, 16 Drawing Sheets

(56) References Cited

U.S. PATENT DOCUMENTS

| | | | |
|---|---|---|---|
| 5,279,980 A | 1/1994 | Hikichi et al. | |
| 5,286,659 A | 2/1994 | Mitani et al. | |
| 5,287,205 A | 2/1994 | Yamazaki et al. | |
| 5,365,079 A | 11/1994 | Kodaira et al. | |
| 5,373,377 A | 12/1994 | Ogawa et al. | |
| 5,453,856 A | 9/1995 | Kim | |
| 5,474,941 A | 12/1995 | Mitani et al. | |
| 5,493,429 A | 2/1996 | Kanemoto et al. | |
| 5,561,440 A * | 10/1996 | Kitajima et al. | 345/87 |
| 5,576,858 A | 11/1996 | Ukai et al. | |
| 5,608,251 A | 3/1997 | Konuma et al. | |
| 5,616,935 A | 4/1997 | Koyama et al. | |
| 5,620,905 A | 4/1997 | Konuma et al. | |
| 5,637,380 A | 6/1997 | Kaneko et al. | |
| 5,643,826 A | 7/1997 | Ohtani et al. | |
| 5,680,187 A | 10/1997 | Nagayama et al. | |
| 5,726,721 A * | 3/1998 | Sumiyoshi et al. | 349/54 |
| 5,734,177 A | 3/1998 | Sakamoto | |
| 5,757,451 A | 5/1998 | Miyazaki et al. | |
| 5,767,924 A | 6/1998 | Hiroki et al. | |
| 5,777,701 A | 7/1998 | Zhang | |
| 5,815,226 A | 9/1998 | Yamazaki et al. | |
| 5,815,232 A * | 9/1998 | Miyazaki et al. | 349/155 |
| 5,867,233 A | 2/1999 | Tanaka | |
| 5,923,962 A | 7/1999 | Ohtani et al. | |
| 5,940,151 A | 8/1999 | Ha | |
| 5,946,065 A | 8/1999 | Tagusa et al. | |
| 5,969,784 A * | 10/1999 | Miyazaki et al. | 349/155 |
| 5,978,061 A * | 11/1999 | Miyazaki et al. | 349/155 |
| 5,986,738 A | 11/1999 | Tagusa et al. | |
| 6,002,463 A | 12/1999 | Fujikawa | |
| 6,031,290 A | 2/2000 | Miyazaki et al. | |
| 6,104,461 A | 8/2000 | Zhang et al. | |
| 6,114,715 A | 9/2000 | Hamada | |
| 6,118,506 A | 9/2000 | Yamazaki et al. | |
| 6,128,050 A * | 10/2000 | Sekiguchi | 349/40 |
| 6,137,551 A | 10/2000 | Jeong | |
| 6,144,082 A | 11/2000 | Yamazaki et al. | |
| 6,147,729 A * | 11/2000 | Kurauchi et al. | 349/106 |
| 6,172,728 B1 | 1/2001 | Hiraishi | |
| 6,175,395 B1 | 1/2001 | Yamazaki et al. | |
| 6,180,542 B1 | 1/2001 | Hwang | |
| 6,208,395 B1 | 3/2001 | Kanoh et al. | |
| 6,211,937 B1 * | 4/2001 | Miyachi et al. | 349/156 |
| 6,222,267 B1 | 4/2001 | Omura | |
| 6,236,064 B1 | 5/2001 | Mase et al. | |
| 6,259,493 B1 | 7/2001 | Nakamura et al. | |
| 6,259,500 B1 * | 7/2001 | Kijima et al. | 349/113 |
| 6,278,131 B1 | 8/2001 | Yamazaki et al. | |
| 6,281,952 B1 * | 8/2001 | Okamoto et al. | 349/12 |
| 6,300,926 B1 | 10/2001 | Yoneya et al. | |
| 6,303,963 B1 | 10/2001 | Ohtani et al. | |
| 6,323,490 B1 | 11/2001 | Ikeda et al. | |
| 6,323,921 B1 * | 11/2001 | Kurauchi et al. | 349/106 |
| 6,327,443 B1 * | 12/2001 | Sekiguchi | 399/42 |
| 6,339,459 B1 | 1/2002 | Ichikawa et al. | |
| 6,365,917 B1 | 4/2002 | Yamazaki | |
| 6,373,546 B1 | 4/2002 | Kim | |
| 6,384,808 B2 | 5/2002 | Azami | |
| 6,388,720 B1 * | 5/2002 | Sekiguchi | 349/40 |
| 6,404,473 B1 | 6/2002 | Kaneko et al. | |
| 6,426,245 B1 | 7/2002 | Kawasaki et al. | |
| 6,432,755 B2 | 8/2002 | Sung et al. | |
| 6,436,815 B1 | 8/2002 | Yamazaki et al. | |
| 6,445,437 B1 * | 9/2002 | Miyazaki et al. | 349/156 |
| 6,451,633 B1 | 9/2002 | Yoshida | |
| 6,461,899 B1 | 10/2002 | Kitakado et al. | |
| 6,462,802 B1 | 10/2002 | Nishimura et al. | |
| 6,463,977 B1 * | 10/2002 | Youn | 349/154 |
| 6,469,317 B1 | 10/2002 | Yamazaki et al. | |
| 6,489,222 B2 | 12/2002 | Yoshimoto | |
| 6,501,098 B2 | 12/2002 | Yamazaki | |
| 6,515,336 B1 | 2/2003 | Suzawa et al. | |
| 6,524,877 B1 | 2/2003 | Nakazawa et al. | |
| 6,534,826 B2 | 3/2003 | Yamazaki | |
| 6,541,294 B1 | 4/2003 | Yamazaki et al. | |
| 6,545,359 B1 | 4/2003 | Ohtani et al. | |
| 6,548,370 B1 | 4/2003 | Kasahara et al. | |
| 6,552,764 B2 | 4/2003 | Fujioka et al. | |
| 6,563,482 B1 * | 5/2003 | Yamazaki et al. | 345/87 |
| 6,563,554 B2 * | 5/2003 | Okamoto et al. | 349/12 |
| 6,567,067 B2 | 5/2003 | Azami | |
| 6,580,475 B2 | 6/2003 | Yamazaki et al. | |
| 6,583,472 B1 | 6/2003 | Shibata et al. | |
| 6,599,788 B1 | 7/2003 | Kawasaki et al. | |
| 6,600,524 B1 | 7/2003 | Ando et al. | |
| 6,613,620 B2 | 9/2003 | Fujimoto et al. | |
| 6,624,013 B2 | 9/2003 | Kawasaki et al. | |
| 6,639,244 B1 | 10/2003 | Yamazaki et al. | |
| 6,646,287 B1 | 11/2003 | Ono et al. | |
| 6,646,692 B2 * | 11/2003 | Yamazaki et al. | 349/47 |
| 6,657,260 B2 | 12/2003 | Yamazaki et al. | |
| 6,664,145 B1 | 12/2003 | Yamazaki et al. | |
| 6,671,025 B1 | 12/2003 | Ikeda et al. | |
| 6,690,033 B2 | 2/2004 | Yamazaki et al. | |
| 6,690,437 B2 * | 2/2004 | Yamazaki et al. | 349/110 |
| 6,707,068 B2 | 3/2004 | Fujimoto et al. | |
| 6,720,577 B2 | 4/2004 | Isobe et al. | |
| 6,731,273 B2 * | 5/2004 | Koyama et al. | 345/204 |
| 6,734,924 B2 | 5/2004 | Hirakata et al. | |
| 6,743,666 B1 | 6/2004 | Chan | |
| 6,747,623 B2 * | 6/2004 | Koyama | 345/87 |
| 6,760,005 B2 * | 7/2004 | Koyama et al. | 345/98 |
| 6,771,346 B2 | 8/2004 | Sugimoto et al. | |
| 6,781,152 B2 * | 8/2004 | Yamazaki | 257/59 |
| 6,789,910 B2 | 9/2004 | Kimura et al. | |
| 6,791,632 B2 * | 9/2004 | Lee et al. | 349/40 |
| 6,819,389 B2 * | 11/2004 | Imayama et al. | 349/153 |
| 6,822,712 B2 * | 11/2004 | Suzuki et al. | 349/115 |
| 6,825,488 B2 * | 11/2004 | Yamazaki et al. | 257/40 |
| 6,859,255 B2 * | 2/2005 | Liao et al. | 349/190 |
| 6,888,160 B1 | 5/2005 | Nakajima et al. | |
| 6,888,608 B2 * | 5/2005 | Miyazaki et al. | 349/156 |
| 6,894,749 B2 * | 5/2005 | Suzuki et al. | 349/113 |
| 6,900,084 B1 * | 5/2005 | Yamazaki | 438/158 |
| 6,900,863 B2 * | 5/2005 | Okamoto et al. | 349/114 |
| 6,927,753 B2 * | 8/2005 | Koyama et al. | 345/100 |
| 6,933,533 B2 | 8/2005 | Yamazaki et al. | |
| 6,953,951 B2 | 10/2005 | Yamazaki et al. | |
| 6,963,084 B2 | 11/2005 | Arao et al. | |
| 6,969,948 B2 * | 11/2005 | Urabe et al. | 313/506 |
| 6,971,938 B2 * | 12/2005 | Urabe et al. | 445/24 |
| 6,984,550 B2 | 1/2006 | Yamazaki et al. | |
| 6,987,552 B2 * | 1/2006 | Yamazaki et al. | 349/141 |
| 6,992,652 B2 * | 1/2006 | Koyama | 345/98 |
| 6,995,753 B2 * | 2/2006 | Yamazaki et al. | 345/204 |
| 7,008,828 B2 | 3/2006 | Ono et al. | |
| 7,023,021 B2 | 4/2006 | Yamazaki et al. | |
| 7,038,303 B2 | 5/2006 | Muranaka | |
| 7,084,019 B2 | 8/2006 | Yamazaki et al. | |
| 7,098,086 B2 | 8/2006 | Shibata et al. | |
| 7,102,165 B2 * | 9/2006 | Yamazaki | 257/59 |
| 7,119,364 B2 * | 10/2006 | Yamazaki | 257/57 |
| 7,145,176 B2 | 12/2006 | Kawasaki et al. | |
| 7,161,177 B2 | 1/2007 | Suzawa et al. | |
| 7,178,435 B2 * | 2/2007 | Yamazaki et al. | 83/39 |
| 7,184,014 B2 * | 2/2007 | Koyama et al. | 345/100 |
| 7,187,356 B2 * | 3/2007 | Koyama et al. | 345/98 |
| 7,208,766 B2 | 4/2007 | Yamazaki et al. | |
| 7,227,542 B2 * | 6/2007 | Koyama | 345/204 |
| 7,295,255 B2 * | 11/2007 | Jun et al. | 349/38 |
| 7,323,715 B2 * | 1/2008 | Yamazaki | 257/59 |
| 7,324,097 B2 * | 1/2008 | Koyama et al. | 345/204 |
| 7,405,115 B2 | 7/2008 | Yamazaki et al. | |
| 7,405,132 B2 | 7/2008 | Arao et al. | |
| 7,411,211 B1 * | 8/2008 | Yamazaki | 257/59 |
| 7,416,928 B2 * | 8/2008 | Kakehata et al. | 438/166 |
| 7,417,613 B2 * | 8/2008 | Koyama | 345/92 |
| 7,482,274 B2 | 1/2009 | Ono et al. | |
| 7,518,592 B2 * | 4/2009 | Koyama et al. | 345/100 |
| 7,521,368 B2 * | 4/2009 | Yamaguchi et al. | 438/706 |
| 7,560,734 B2 | 7/2009 | Ono et al. | |
| 7,575,965 B2 * | 8/2009 | Kuwabara et al. | 438/151 |
| 7,612,849 B2 * | 11/2009 | Eguchi et al. | 349/114 |

| | | | |
|---|---|---|---|
| 7,626,202 B2 * | 12/2009 | Yamazaki | 257/59 |
| 7,696,973 B2 * | 4/2010 | Koyama et al. | 345/98 |
| 7,795,616 B2 * | 9/2010 | Yamazaki et al. | 257/57 |
| 7,799,590 B2 * | 9/2010 | Yamazaki et al. | 438/40 |
| 7,833,845 B2 * | 11/2010 | Yamazaki et al. | 438/149 |
| 7,858,455 B2 * | 12/2010 | Yamazaki | 438/152 |
| 7,893,913 B2 * | 2/2011 | Koyama et al. | 345/100 |
| 7,897,968 B2 * | 3/2011 | Kuwabara et al. | 257/57 |
| 7,902,550 B2 * | 3/2011 | Yamazaki | 257/59 |
| 7,956,359 B2 * | 6/2011 | Yamazaki | 257/59 |
| 7,998,800 B2 * | 8/2011 | Yamazaki | 438/149 |
| 8,017,456 B2 * | 9/2011 | Yamazaki et al. | 438/149 |
| 8,259,279 B2 * | 9/2012 | Shoraku et al. | 349/156 |
| 2001/0004273 A1 | 6/2001 | Sugimoto et al. | |
| 2001/0025959 A1 | 10/2001 | Yamazaki et al. | |
| 2001/0030322 A1 | 10/2001 | Yamazaki et al. | |
| 2001/0040655 A1 | 11/2001 | Yamazaki et al. | |
| 2001/0052950 A1 | 12/2001 | Yamazaki et al. | |
| 2002/0001887 A1 | 1/2002 | Sung et al. | |
| 2002/0008689 A1 * | 1/2002 | Koyama et al. | 345/100 |
| 2002/0011978 A1 * | 1/2002 | Yamazaki et al. | 345/87 |
| 2002/0013022 A1 | 1/2002 | Yamazaki et al. | |
| 2002/0015032 A1 * | 2/2002 | Koyama et al. | 345/204 |
| 2002/0016028 A1 | 2/2002 | Arao et al. | |
| 2002/0017645 A1 | 2/2002 | Yamazaki et al. | |
| 2002/0024485 A1 * | 2/2002 | Koyama | 345/87 |
| 2002/0041266 A1 * | 4/2002 | Koyama et al. | 345/87 |
| 2002/0054009 A1 * | 5/2002 | Koyama et al. | 345/100 |
| 2002/0070382 A1 | 6/2002 | Yamazaki et al. | |
| 2002/0110941 A1 | 8/2002 | Yamazaki et al. | |
| 2002/0113763 A1 * | 8/2002 | Koyama | 345/87 |
| 2002/0145143 A1 | 10/2002 | Kawasaki et al. | |
| 2002/0158288 A1 | 10/2002 | Yamazaki et al. | |
| 2002/0197421 A1 * | 12/2002 | Yamazaki et al. | 428/1.1 |
| 2003/0107314 A1 * | 6/2003 | Urabe et al. | 313/506 |
| 2004/0126945 A1 | 7/2004 | Shibata et al. | |
| 2004/0147200 A1 * | 7/2004 | Urabe et al. | 445/24 |
| 2004/0201410 A1 * | 10/2004 | Koyama et al. | 327/333 |
| 2004/0222955 A1 * | 11/2004 | Koyama | 345/87 |
| 2004/0233231 A1 * | 11/2004 | Koyama et al. | 345/691 |
| 2005/0056848 A1 | 3/2005 | Yamazaki et al. | |
| 2005/0157236 A1 | 7/2005 | Kawasaki | |
| 2005/0230838 A1 | 10/2005 | Ono et al. | |
| 2005/0243050 A1 * | 11/2005 | Koyama et al. | 345/98 |
| 2006/0066765 A1 * | 3/2006 | Koyama | 349/38 |
| 2006/0082568 A1 * | 4/2006 | Yamazaki et al. | 345/207 |
| 2006/0273317 A1 | 12/2006 | Yamazaki et al. | |
| 2007/0109247 A1 * | 5/2007 | Koyama et al. | 345/98 |
| 2007/0164942 A1 * | 7/2007 | Koyama et al. | 345/83 |
| 2007/0184665 A1 | 8/2007 | Yamazaki et al. | |
| 2009/0079915 A1 * | 3/2009 | Kurasawa | 349/106 |
| 2010/0051959 A1 | 3/2010 | Moriwaki | |
| 2010/0097553 A1 * | 4/2010 | Shoraku et al. | 349/122 |
| 2010/0163867 A1 | 7/2010 | Yamazaki et al. | |
| 2010/0193783 A1 | 8/2010 | Yamazaki et al. | |
| 2010/0213461 A1 | 8/2010 | Akimoto et al. | |
| 2010/0264412 A1 | 10/2010 | Yamazaki et al. | |
| 2011/0084273 A1 * | 4/2011 | Yamazaki et al. | 257/43 |
| 2011/0317108 A1 * | 12/2011 | Yamazaki et al. | 349/106 |
| 2012/0273780 A1 * | 11/2012 | Yamazaki et al. | 257/43 |

FOREIGN PATENT DOCUMENTS

| | | |
|---|---|---|
| EP | 884624 A2 | 12/1998 |
| EP | 1128430 A2 | 8/2001 |
| JP | 59-195268 A | 11/1984 |
| JP | 62250416 A | 10/1987 |
| JP | 63-070832 A | 3/1988 |
| JP | 63-253391 A | 10/1988 |
| JP | 02-230129 A | 9/1990 |
| JP | 02-287303 A | 11/1990 |
| JP | 03-059522 B2 | 3/1991 |
| JP | 03-175430 A | 7/1991 |
| JP | 05-055573 A | 3/1993 |
| JP | 6-148685 A | 5/1994 |
| JP | 06-260645 A | 9/1994 |
| JP | 06-281957 A | 10/1994 |
| JP | 06-331975 A | 12/1994 |
| JP | 7-235680 A | 9/1995 |
| JP | 08-106108 A | 4/1996 |
| JP | 8-274336 A | 10/1996 |
| JP | 08-328000 A | 12/1996 |
| JP | 09-055508 A | 2/1997 |
| JP | 9-160509 A | 6/1997 |
| JP | 09-197435 A | 7/1997 |
| JP | 09-279367 A | 10/1997 |
| JP | 10-048640 A | 2/1998 |
| JP | 10-048651 A | 2/1998 |
| JP | 10-073813 A | 3/1998 |
| JP | 1-101519 A | 4/1998 |
| JP | 10-170959 A | 6/1998 |
| JP | 10-197712 A | 7/1998 |
| JP | 10-221704 A | 8/1998 |
| JP | 10-221715 A | 8/1998 |
| JP | 11-002843 A | 1/1999 |
| JP | 11-183915 A | 7/1999 |
| JP | 11-271792 A | 10/1999 |
| JP | 11-271806 A | 10/1999 |
| JP | 11-352513 A | 12/1999 |
| JP | 11-354804 A | 12/1999 |
| JP | 2000-019561 A | 1/2000 |
| JP | 2010217926 A * | 9/2010 |

OTHER PUBLICATIONS

Amendment (U.S. Appl. No. 09/848,642), dated Jul. 2, 2008.

* cited by examiner

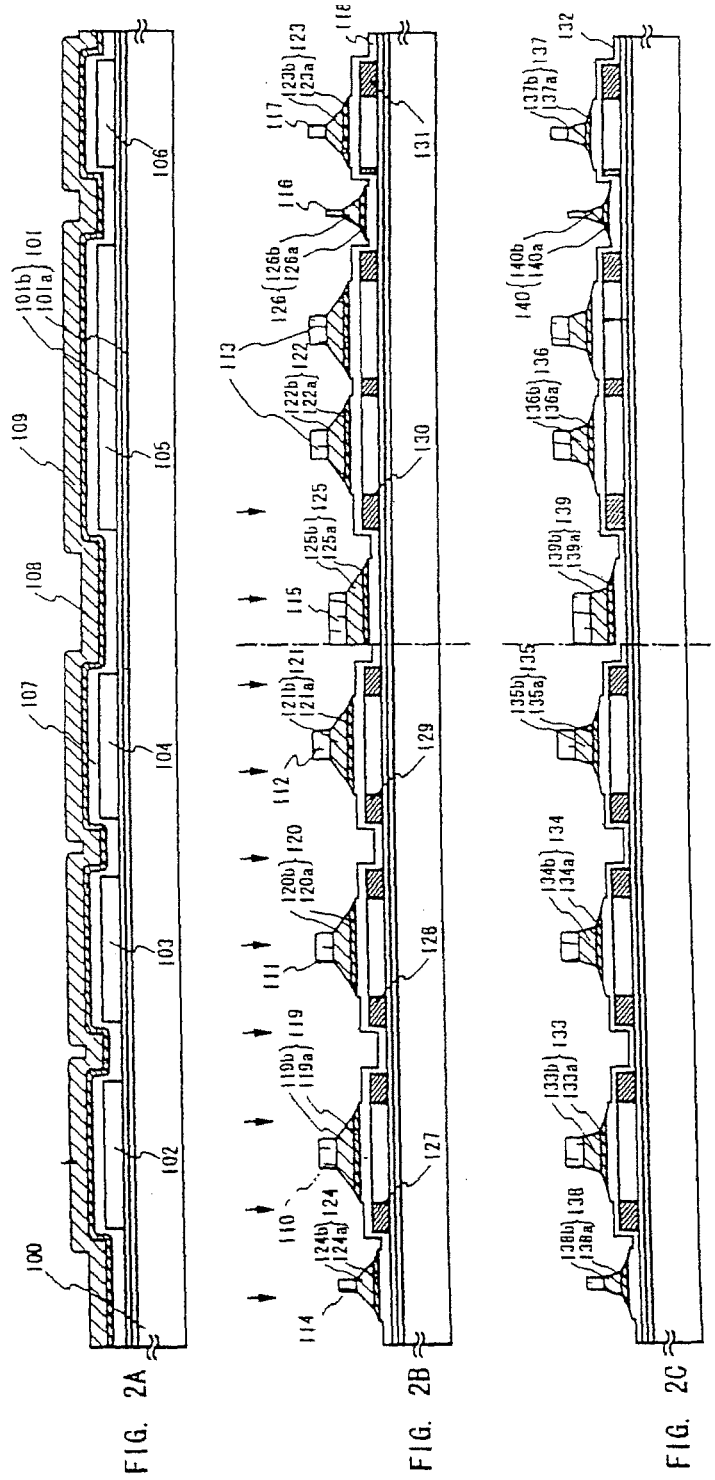

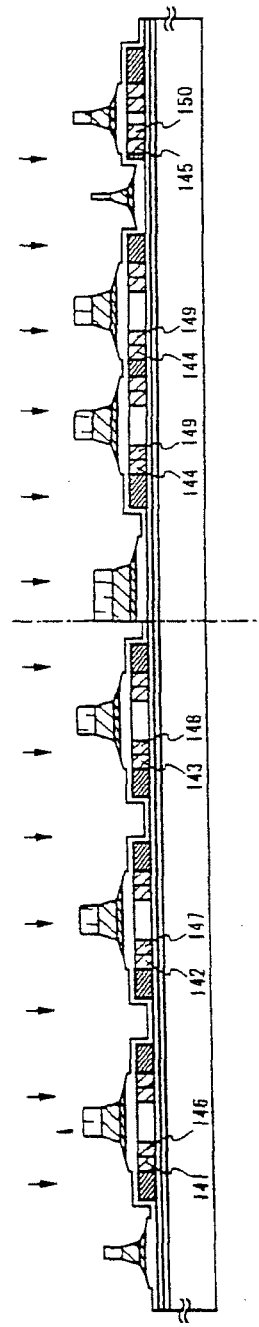
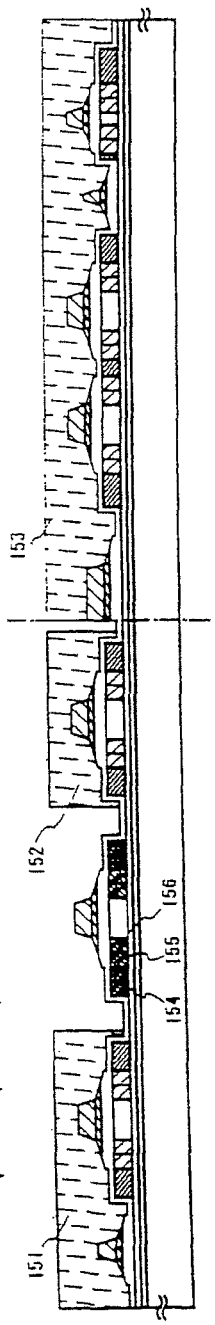
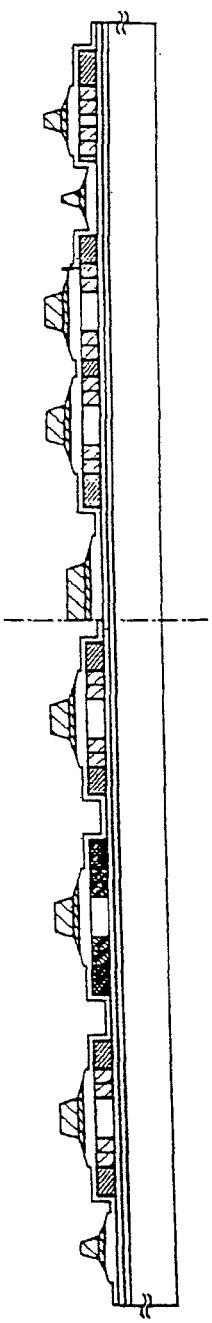
FIG. 3A
FIG. 3B
FIG. 3C

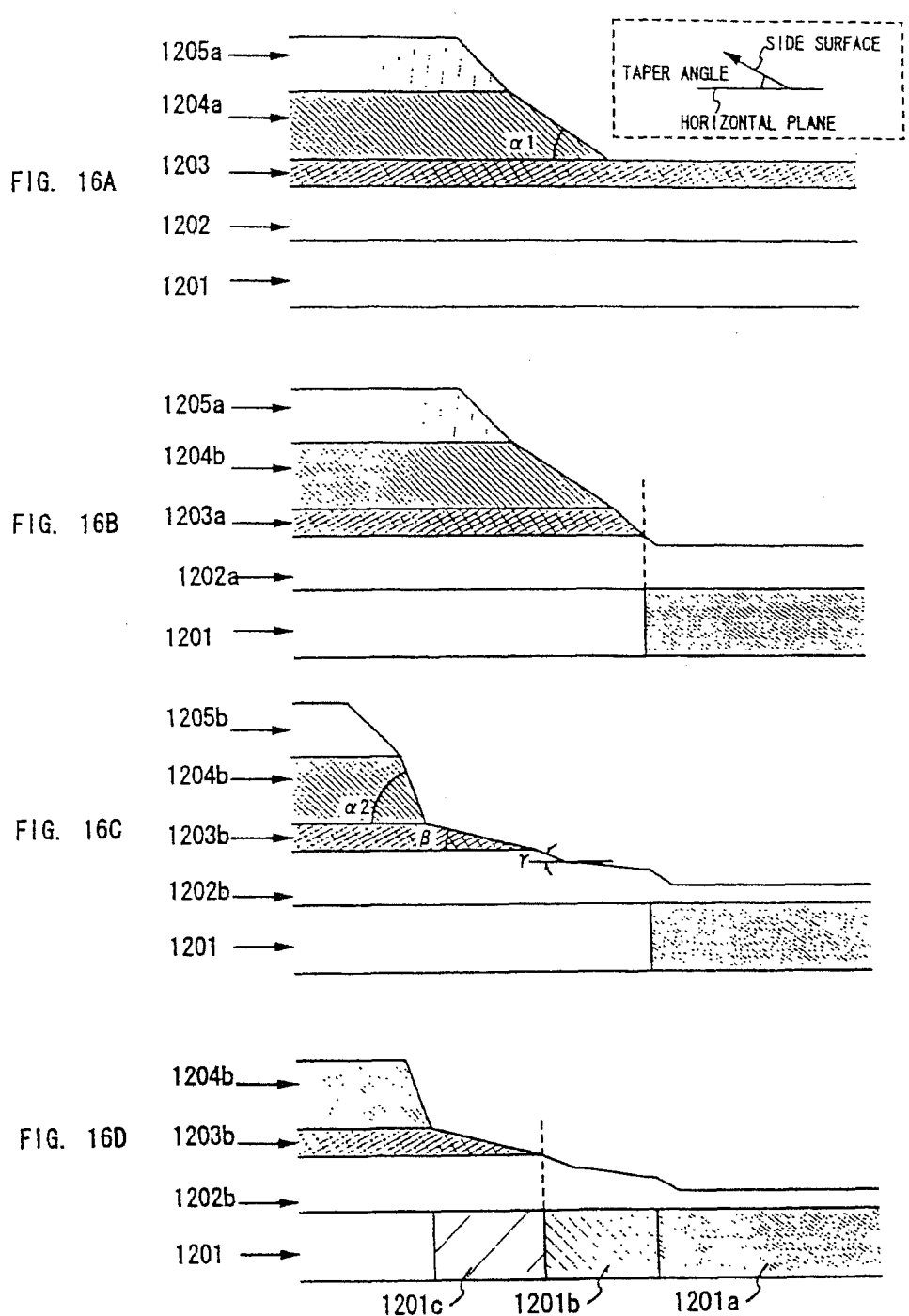

SEMICONDUCTOR DEVICE AND MANUFACTURING METHOD THEREOF

CROSS-REFERENCE TO RELATED APPLICATIONS

This application is a continuation of U.S. application Ser. No. 11/695,159, filed Apr. 2, 2007, now allowed, which is a continuation of U.S. application Ser. No. 10/959,056, filed Oct. 7, 2004, now U.S. Pat. No. 7,799,590, which is a divisional of U.S. application Ser. No. 09/769,765, filed Jan. 26, 2001, now U.S. Pat. No. 6,825,488, which claims the benefit of a foreign priority application filed in Japan as Serial No. 2000-018097 on Jan. 26, 2000, all of which are incorporated by reference.

BACKGROUND OF THE INVENTION

1. Field of the Invention

The present invention relates to a semiconductor device containing a circuit structured by a thin film transistor (hereinafter referred to as a TFT), and to a method of manufacturing thereof. For example, the present invention relates to an electro-optical device, typically a liquid crystal display panel, and to electronic equipment (electronic instruments) loaded with this type of electro-optical device as a part.

Note that, throughout this specification, the term semiconductor device indicates general devices which function by utilizing semiconductor characteristics, and that electro-optical devices, semiconductor circuits, and electronic equipment are all semiconductor devices.

2. Description of the Related Art

Techniques of structuring a thin film transistor (TFT) using a semiconductor thin film (having a thickness on the order of several nm to several hundreds of nm) formed on a substrate having an insulating surface have been in the spotlight in recent years. The thin film transistor is widely applied in electronic devices such as ICs and electro-optical devices, and in particular, its development is accelerating as a switching element of a liquid crystal display device.

Active matrix liquid crystal display devices which use TFTs as switching elements for connecting to pixel electrodes arranged in a matrix shape are gathering attention for use in obtaining a high quality image in a liquid crystal display device.

Active matrix liquid crystal display devices are roughly divided into two types, a transmitting type and a reflecting type.

In particular, the reflecting type liquid crystal display device has the advantage of low energy consumption compared to the transmitting type liquid crystal display device because it does not use a backlight, and its demand in direct view displays for mobile computers and video cameras is high.

Note that the reflecting type liquid crystal display device utilizes the optical modulation action of a liquid crystal, and a state of outputting incident light, which is reflected by pixel electrodes, to the outside of the device, and a state of not outputting incident light to the outside of the device are selected, performing bright and dark display. In addition, display of an image is performed by combining these two states. The pixel electrodes in a reflecting type liquid crystal display device are generally composed of a metallic material having a high light reflectivity, such as aluminum, and these are electrically connected to switching elements such as thin film transistors.

Gate wirings (scanning lines), source wirings (signal lines), and capacitor wirings are each patterned into a linear shape with the pixel structure of a conventional reflecting type liquid crystal display device. Further, the source wirings are arranged in a horizontal direction, the gate wirings are arranged in a vertical direction, and interlayer insulating films are formed between the gate wirings and the source wirings in order to insulate the wirings. In addition, in a conventional structure, a portion of the source wirings and a portion of the gate wirings intersect, and TFTs are arranged in the vicinity of the intersecting portions.

Furthermore, an additional interlayer insulating film is formed on the source wirings conventionally, and the pixel electrodes are formed on this interlayer insulating film. The number of steps increases when the number of layers increases with this structure, and this invites an increase in costs.

A structure in which pixel electrodes are formed between source wirings at the same time the source wirings are formed is known as another conventional structure. In this case, it is necessary to perform shielding, by using a black matrix between the source wirings and the pixel electrodes.

Shielding of a TFT and shielding between pixels are conventionally performed in accordance with a black matrix, in which a metallic film formed of a material such as chrome is patterned into a desired shape. However, in order to have sufficient shielding of light by the black matrix, it is necessary to insulate by forming an interlayer insulating film between the black matrix and the pixel electrodes. If the number of layers of interlayer insulating films thus increases, the number of steps increases, inviting increased costs. Further, it is disadvantageous to have interlayer insulating properties. In addition, the number of steps for forming the black matrix itself and the number of masks are increased.

Seen from the viewpoint of display performance, a storage capacitor and a high aperture ratio are required for pixels. By giving each pixel a high aperture ratio, the efficiency of light usage increases, and the display device can be made energy efficient and small in size.

The reduction in the size of pixels has been advancing in recent years, and higher definition images are demanded. The reduction in pixel size means that the amount of surface area occupied for forming a TFT and wirings for each pixel becomes larger, and the aperture ratio of the pixels decreases.

In order to obtain a high aperture ratio in each pixel within standard size pixels, it is indispensable to layout the circuit elements required in the circuit structure of the pixel very efficiently.

SUMMARY OF THE INVENTION

A completely new pixel structure, not found conventionally, is thus required in order to realize a reflecting type liquid crystal display device having a high pixel aperture ratio by using a small number of masks.

In order to respond to the above demands, an object of the present invention is to provide a reflecting type liquid crystal display device having a pixel structure in which a high aperture ratio is achieved without increasing the number of masks and the number of steps.

In order to solve the problems associated with conventional techniques, the following means are devised.

The present invention has a pixel structure in which TFTs and pixels are shielded without using a black matrix. In order to shield between pixels, gate wirings and source wirings are formed on the same insulating film (first insulating film), and pixel electrodes are arranged overlapping the gate wirings or the source wirings, sandwiching an insulating film (second insulating film) therebetween. Further, in order to shield the TFTs from light, color filters (a red color filter, or a lamination film of a red color filter and a blue color filter) are arranged on an opposing substrate as light shielding films overlapping the TFTs on an element substrate.

According to the structure of the present invention disclosed in this specification, as shown in an example of FIG. 1, there is provided a semiconductor device comprising:

a first semiconductor layer and a second semiconductor layer on an insulating surface;

a first insulating film on the first semiconductor layer and on the second semiconductor layer;

a gate wiring on the first insulating film, overlapping the first semiconductor layer;

a capacitor wiring on the first insulating film, positioned over the second semiconductor layer;

an island shape source wiring on the first insulating film;

a second insulating film covering the gate wiring, the capacitor wiring, and the island shape source wiring;

a connection electrode on the second insulating film, connected to the island shape source wiring and the first semiconductor layer; and a pixel electrode on the second insulating film, connected to the first semiconductor layer;

characterized in that the pixel electrode overlaps the island shape source wiring, sandwiching the second insulating film therebetween.

According to the above structure, a plurality of the island shape source wirings are arranged in each pixel, and the island shape source wirings are each connected to the connection electrodes. Further, the pixel electrode overlaps the gate wiring, sandwiching the second insulating film therebetween.

According to another structure of the present invention, a semiconductor device comprising a first substrate, a second substrate, and a liquid crystal maintained between the joined first substrate and second substrate, characterized in that:

a pixel portion having a thin film transistor, and a driver circuit, having a thin film transistor are formed on the first substrate;

the pixel portion has a semiconductor layer, a first insulating film covering the semiconductor layer, wirings on the first insulating film, a second insulating film covering the wirings, and electrodes on the second insulating film;

a red color filter, a blue color filter, and a green color filter corresponding to each pixel of the pixel portion are formed on the second substrate; and a lamination film of the red color filter and the blue color filter on the second substrate becomes a light shielding film overlapping the thin film transistor on the first substrate.

According to the above structure, the wirings are a gate wiring, an island shape source wiring, and a capacitor wiring. The storage capacitor having the first insulating film as a dielectric is formed in a region in which, the capacitor wiring and the semiconductor layer overlap, sandwiching the first insulating film therebetween. The electrodes are a pixel electrode connected to the semiconductor layer, and a connection electrode connected to the island shape source wiring.

According to the above structure, a gap between the first substrate and the second substrate is maintained by a spacer composed of a lamination film of the red color filter, the blue color filter, and the green color filter.

According to another structure of present invention, as shown in an example of FIG. 10, there is provided a semiconductor device comprising:

a first semiconductor layer and a second semiconductor layer on an insulating surface;

a first insulating film on the first semiconductor layer and on the second semiconductor layer;

a first electrode on the first insulating film, overlapping the first semiconductor layer;

a second electrode on the first insulating film, overlapping the second semiconductor layer;

a source wiring on the first insulating film;

a second insulating film covering the first electrode and the source wiring;

a gate wiring on the second insulating film, connected to the first electrode;

a connection electrode on the second insulating film, connected to the source wiring and the first semiconductor layer; and a pixel electrode on the second insulating film, connected to the first semiconductor layer;

characterized in that the pixel electrode overlays the source wiring, sandwiching the second insulating film therebetween.

According to the above structure, the first electrode overlapping the first semiconductor layer is a gate electrode. The storage capacitor is formed by the second semiconductor layer connected to the pixel electrode, and the second electrode connected to a gate wiring of an adjacent pixel, with the first insulating film as a dielectric.

According to the above structure, the gate wiring is formed of a film having an element selected from the group consisting of: polysilicon doped with an impurity element which imparts one conductivity; W; SIX; Al; Cu; Ta; Cr; and Mo as its main constituent, or a lamination film of the elements.

According to the above structure, the second insulating film is composed of a first insulating layer having silicon as its main constituent, and a second insulating layer formed of an organic resin material.

Further, according to another structure of the present invention, there is provided a semiconductor device comprising TFT containing a semiconductor layer formed on an insulating surface, an insulating film formed on the semiconductor layer, and a gate electrode formed on the insulating film, characterized in that:

the gate electrode has a first conductive layer with a tapered shape edge portion as a lower layer, and a second conductive layer having a narrower width than that of the first conductive layer as an upper layer; and the semiconductor layer includes: a channel forming region overlapping the second conductive layer, sandwiching the insulating film therebetween; a third impurity region formed contacting the channel forming region; a second impurity region formed contacting the third impurity region; and a first impurity region formed contacting the second impurity region.

Further, an angle formed between the inclined surface of the first conductive layer and the horizontal plane (also referred to as a taper angle) is smaller than an angle formed between the inclined surface of the second conductive layer and the horizontal plane. For convenience, the inclined surface having the taper angle is referred to as a tapered shape, and a portion having the tapered shape is referred to as a tapered portion, throughout this specification.

Furthermore, according to the above structure, the third impurity region overlaps the first conductive layer, sandwiching the insulating film therebetween. The third impurity region is formed by doping an impurity element into the semiconductor layer, through the first conductive layer having the tapered portion in the edge portion, and through the insulating film. Further, the depth to an ion is injected during doping is shallower the thicker the material layer arranged on the semiconductor layer becomes. The concentration of the impurity element added within the semiconductor layer therefore also changes by being influenced by the film thickness of the conductive layer having the tapered shape. The concentration of the impurity element within the semiconductor layer decreases in accordance with an increase in film thickness of the first conductive layer, and the concentration increases as the film thickness becomes thinner.

According to the above structure, the first impurity region is a source region or a drain region.

Further, according to the above structure, a region of the insulating film which overlaps with the second impurity region contains a tapered portion. The second impurity region is formed by doping an impurity element into the semiconductor layer through the insulating film. The impurity concentration distribution of the second impurity region therefore also changes, being influenced by the tapered portion of the insulating film. The impurity concentration within the second impurity region decreases in accordance with an increase in film thickness of the insulating film, and the concentration increases as the insulating film thickness decreases. Note that, although the second impurity region is formed by the same doping as the third impurity region, the second impurity region does not overlap with the first conductive layer. Therefore, the impurity concentration of the second impurity region is higher than the impurity concentration of the third impurity region. Further, the width of the second impurity region in the channel longitudinal direction is the same width as the third impurity region, or is wider than the width of the third impurity region.

According to the above structure, the TFTs are n-channel TFTs or p-channel TFTs. Further, pixel TFTs are formed using n-channel TFTs in the present invention, and driver circuits are provided with CMOS circuits using n-channel TFTs or p-channel TFTs.

Further, according to the above structure, the semiconductor device is a reflecting type liquid crystal display device.

According to a structure of the present invention in manufacturing process for attaining the above constitution, there is provided a method of manufacturing a semiconductor device, comprising:

a first step for forming a first semiconductor layer and a second semiconductor layer, made of crystalline semiconductor films, on an insulating surface;

a second step for forming a first insulating film on the first semiconductor layer and on the second semiconductor layer;

a third step for forming: a gate wiring on the first insulating film, overlapping the first semiconductor layer; a capacitor wiring on the first insulating film, positioned over the second semiconductor layer; and an island shape source wiring on the first insulating film;

a fourth step for forming a second insulating film covering the gate wiring, the capacitor wiring, and the island shape source wiring; and a fifth step for forming: a connection electrode on the second insulating film, connected to the island shape source wiring and to the first semiconductor layer; and a pixel electrode overlapping the island shape source wiring.

According to another structure of the present invention in the manufacturing process for attaining the above constitution, there is provided a method of manufacturing a semiconductor device having a liquid crystal sandwiched between a pair of substrates, comprising:

a first step for forming a first semiconductor layer, and a second semiconductor layer, made of crystalline semiconductor films, on a first substrate;

a second step for forming a first insulating film on the first semiconductor layer and on the second semiconductor layer;

a third step for forming: a gate wiring on the first insulating film, overlapping the first semiconductor layer; a capacitor wiring on the first insulating film, positioned over the second semiconductor layer; and an island shape source wiring on the first insulating film;

a fourth step for forming a second insulating film covering the gate wiring, the capacitor wiring, and the island shape source wiring;

a fifth step for forming: a connection electrode on the second insulating film, connected to the island shape source wiring and to the first semiconductor layer; and a pixel electrode overlapping the island shape source wiring;

a sixth step for forming, on the second substrate, a red color filter, a blue color filter, and a green color filter corresponding to each pixel electrode, and for simultaneously forming a light shielding film, composed of a lamination film of the red color filter and the blue color filter, so as to overlap with at least the first semiconductor layer; and a seventh step for joining the first substrate and the second substrate.

According to another structure of the present invention in the manufacturing process for attaining the above constitution, there is provided a method of manufacturing a semiconductor device, comprising:

a first step for forming a first semiconductor layer and a second semiconductor layer, made of crystalline semiconductor films, on an insulating surface;

a second step for forming a first insulating film on the first semiconductor layer and on the second semiconductor layer;

a third step for forming, on the first insulating film: a first electrode overlapping the first semiconductor layer; a second electrode overlapping the second semiconductor layer; and a source wiring;

a fourth step for forming a second insulating film covering the first electrode, the second electrode, and the source wiring; and a fifth step for forming, on the second insulating film: a gate wiring connected to the first electrode; a connection electrode connected to the first semiconductor layer and to the source wiring; and a pixel electrode overlapping the source wiring.

According to the above structure, the second semiconductor layer connected to the pixel electrode overlaps the second electrode connected to a gate wiring of an adjacent pixel, sandwiching the first insulating film therebetween.

Further, according to another structure of the present invention in the manufacturing process for attaining the above constitution, there is provided a method of manufacturing a semiconductor device having a liquid crystal sandwiched between a pair of substrates, comprising:

a first step for forming a first semiconductor layer, and a second semiconductor layer, made of crystalline semiconductor films, on a first substrate;

a second step for forming a first insulating film on the first semiconductor layer and on the second semiconductor layer;

a third step for forming, on the first insulating film: a first electrode overlapping the first semiconductor layer; a second electrode overlapping the second semiconductor layer; and a source wiring;

a fourth step for forming a second insulating film covering the first electrode, the second electrode, and the source wiring;

a fifth step for forming, on the second insulating film: a gate wiring connected to the first electrode; a connection electrode connected to the first semiconductor layer and to the source wiring; and a pixel electrode overlapping the source wiring;

a sixth step for forming, on the second substrate, a red color filter, a blue color filter, and a green color filter corresponding to each pixel electrode, and for simultaneously forming a light shielding film, composed of a lamination film of the red color filter and the blue color filter, so as to overlap with at least the first semiconductor layer; and a seventh step for joining the first substrate and the second substrate.

According to another structure of the present invention in the manufacturing process for attaining the above constitution, there is provided a method of manufacturing a semiconductor device, comprising the steps of:

forming a semiconductor layer on an insulating surface;
forming an insulating film on the semiconductor layer;
forming a first conductive layer and a second conductive layer on the insulating film;
adding an impurity element which imparts one conductivity, using the first conductive layer and the second conductive layer as a mask, forming a first impurity region;
etching the first conductive layer and the second conductive layer, forming a first conductive layer having a tapered portion and a second conductive layer having a tapered portion; and
adding an impurity element which imparts one conductivity into the semiconductor layer through the insulating film, forming a second impurity region and simultaneously adding an impurity element which imparts one conductivity into the semiconductor layer, through the tapered portion of the first conductive layer, forming a third impurity region in which the impurity concentration increases toward an edge portion of the semiconductor layer.

Furthermore, according to another structure of the present invention in the manufacturing process for attaining the above constitution, there is provided A method of manufacturing a semiconductor device, comprising the steps of:

forming a semiconductor layer on an insulating surface;
forming an insulating film on the semiconductor layer;
forming a first conductive layer and a second conductive layer on the insulating film;
adding an impurity element which imparts one conductivity, using the first conductive layer and the second conductive layer as a mask, forming a first impurity region;
etching the first conductive layer, the second conductive layer, and the insulating film, forming a first conductive layer having a tapered portion and a second conductive layer having a tapered portion, and an insulating film having a portion of the tapered portion; and
adding an impurity element which imparts one conductivity into the semiconductor layer, through the insulating film having a portion of the tapered portion, forming a second impurity region; and simultaneously adding an impurity element which imparts one conductivity into the semiconductor layer, through the tapered portion of the first conductive layer, forming a third impurity region in which the impurity concentration increases toward an edge portion of the semiconductor layer.

BRIEF DESCRIPTION OF THE DRAWINGS

In the accompanying drawings:

FIGS. 2A to 2C are diagrams showing a process of manufacturing an active matrix substrate (Embodiment 1);

FIGS. 3A to 3C are diagrams showing the process of manufacturing the active matrix substrate (Embodiment 1);

FIGS. 16A to 16D are diagrams showing enlarged cross sections of a process of manufacturing an active matrix substrate.

DETAILED DESCRIPTION OF THE PREFERRED EMBODIMENTS

Embodiment modes of the present invention are explained below.

A reflecting display device of the present invention is provided with an element substrate and an opposing substrate, adhered to each other and sandwiching a predetermined gap therebetween, and an electro-optical substance (such as a liquid crystal) maintained in the gap.

Embodiment Mode 1

Figure 1:
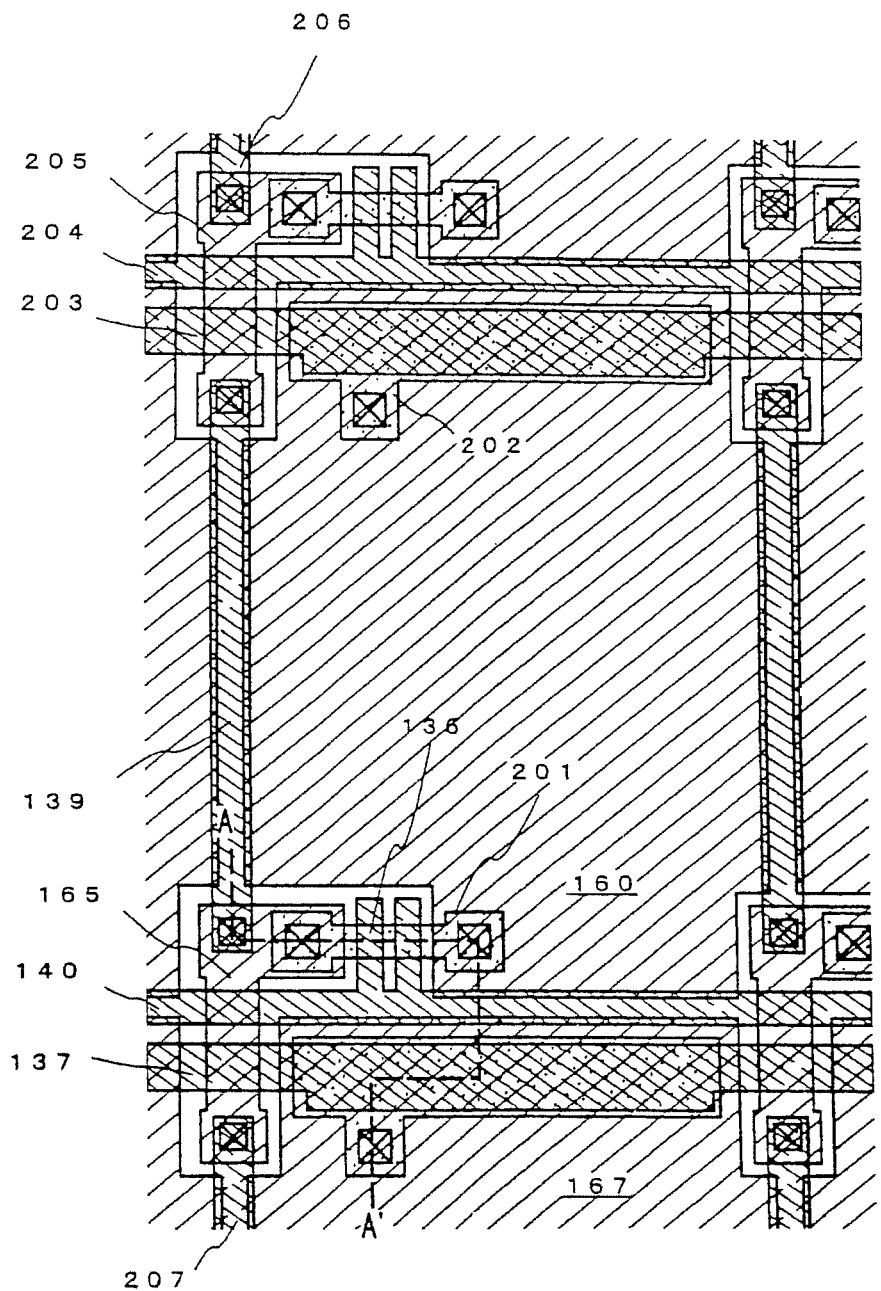
FIG. 1 is a top view of a pixel portion of the present invention (Embodiment 1)

A specific example of a pixel structure of the present invention is shown in FIG. 1.

An element substrate contains: a pixel portion having gate wirings 140 and capacitor wirings 137 arranged in a horizontal direction, source wirings arranged in a vertical direction, and pixel TFTs near intersecting portion of the gate wirings and the source wirings; and a driver circuit having n-channel TFTs and p-channel TFTs, as shown in FIG. 1.

Note that the source wirings in FIG. 1 indicate wirings in which island shape source wirings 139 and connection electrodes 165, arranged in a vertical direction, are connected. Note also that the island shape source wirings 139 are formed on and contacting a gate insulating film, similar to the gate wirings 140 (including gate electrodes 136) and the capacitor wirings 137. Further, the connection electrodes 165 are formed on an interlayer insulating film, similar to pixel electrodes 167 and 160.

The space between respective pixels is shielded from light in accordance with this type of structure, mainly by the overlap of an edge portion of the pixel electrodes 160 with the island shape source wirings 139 and the gate wirings 140.

Note that, in order to shield the TFTs on the element substrate, red color filters, lamination films of a red color filter and a blue color filter, or lamination films of a red color filter, a blue color filter, and a green color filter are formed in alignment with predetermined positions on an opposing substrate (positions of the TFTs of the element substrate) by patterning.

The TFTs of the element substrate can thus be shielded from light, mainly by the color filters (red color filters, lamination films of the red color filter and the blue color filter, or lamination films of the red color filter, the blue color filter, and the green color filter) formed on the opposing substrate in accordance with this type of structure.

Further, storage capacitors of the pixel electrodes 160 are formed by second semiconductor layers 202 connected to the pixel electrodes 160 and capacitor wirings 203 with an insulating film covering the second semiconductor layers 202 as a dielectric.

The number of mask layers necessary for forming the element substrate composed of the pixel portion, having the pixel structure shown in FIG. 1, and the driver circuit, can be set to five. Namely: a first layer is a mask for patterning first semiconductor layers 201 and the second semiconductor layers 202, a second layer is a mask for patterning the gate wirings 140 and gate wirings 204, the capacitor wirings 137 and the capacitor wirings 203, and the island shape source wirings 139 and island shape source wirings 206 and 207; a third layer is a mask for covering n-channel TFTs when adding an impurity element which imparts p-type conductivity in order to form p-channel TFTs of the driver circuit; a fourth layer is a mask for forming contact holes for reaching the first semiconductor layers, the second semiconductor layers, and the island shape source wirings, respectively; and a fifth layer is a mask for patterning the connection electrodes 165 and connection electrodes 205, and the pixel electrodes 160 and 167.

A reflecting type liquid crystal display device having a high pixel aperture ratio can thus be realized with a small number of masks when using the pixel structure shown in FIG. 1.

Embodiment Mode 2

Figure 10:
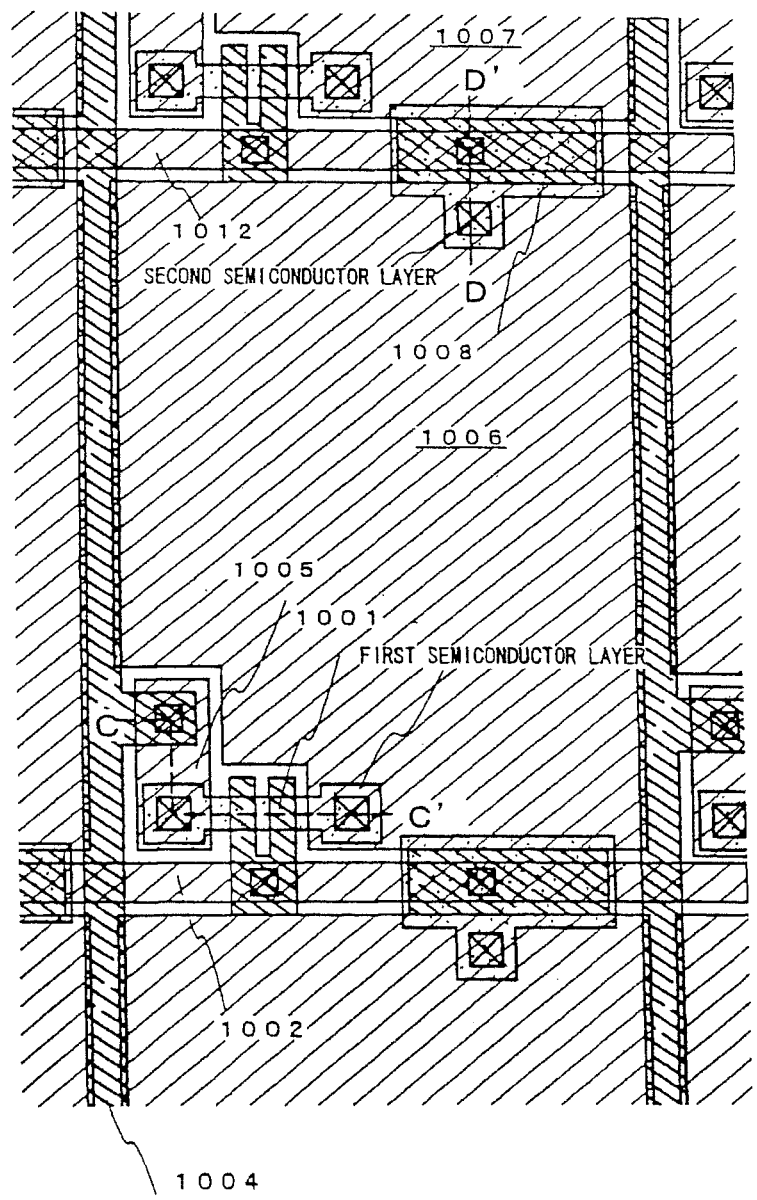
FIG. 10 is a top view of a pixel portion of the present invention (Embodiment 6)

A specific example of a pixel structure of the present invention is shown in FIG. 10.

An element substrate contains: a pixel portion having gate wirings 1002 and 1012 arranged in a horizontal direction, source wirings 1004 arranged in a vertical direction and pixel TFTs near intersecting portion of the gate wirings and the source wirings; a driver circuit having n-channel TFTs and p-channel TFTs, as shown in FIG. 10.

Note that the gate wirings in FIG. 10 indicate wirings in which island shape gate electrodes 1001 and island shape capacitor electrodes 1008, arranged in a vertical direction are connected. Note also that the island shape gate electrodes 1001 are formed on and contacting a gate insulating film, similar to the source wirings 1004 and the capacitor electrodes 1008. Further, the gate wirings 1002 and 1012 are formed on an interlayer insulating film, similar to pixel electrodes 1006 and 1007 and connection electrodes 1005.

The space between respective pixels is shielded from light in accordance with this type of structure, mainly by the overlap of an edge portion of the pixel electrodes 1006 with the source wirings 1004.

Further, the TFTs of the element substrate can be shielded from light, mainly by color filters (red color filters, lamination films of a red color filter and a blue color filter, or lamination films of a red color filter, a blue color filter, and a green color filter) formed on an opposing substrate in accordance with this type of structure, similar to Embodiment Mode 1. In addition, it is necessary to shield the gaps between the gate wirings and the pixel electrodes with the pixel structure of FIG. 10. Therefore, light shielding can be performed by using color filters similarly formed on the opposing substrate in these portions.

Further, storage capacitors of the pixel electrodes 1006 are formed by second semiconductor layers connected to the pixel electrodes 1006, and the capacitor electrodes 1008 connected to the gate wirings 1012, with an insulating film covering the second semiconductor layers as a dielectric.

The number of mask layers necessary for forming the element substrate composed of the pixel portion having the pixel structure shown in FIG. 10, and the driver circuit, can be set to five, similar to FIG. 1. Namely: a first layer is a mask for patterning the first conductive layers and the second conductive layers; a second layer is a mask for patterning the gate electrodes 1001, the capacitor electrodes 1008, and the source wirings 1004; a third layer is a mask for covering n-channel TFTs when adding an impurity element which imparts p-type conductivity in order to form p-channel TFTs of the driver circuit; a fourth layer is a mask for forming contact holes for reaching the first semiconductor layers, the second semiconductor layers, the gate electrodes, the capacitor electrodes and the source wirings; and a fifth layer is a mask for patterning selection the connection electrodes 1005, the gate wirings 1002 and 1012 and the pixel electrodes 1006 and 1007.

A reflecting type liquid crystal display device having a high pixel aperture ratio can thus be realized with a small number of masks when using the pixel structure shown in FIG. 10.

An additionally detailed explanation of the present invention having the above structure is made using the embodiments shown below.

Embodiment 1

A method of manufacturing a pixel portion and TFTs (an n-channel TFT and a p-channel TFT) of a driver circuit formed in the periphery of the pixel portion, at the same time and on the same substrate is explained in detail in Embodiment 1.

First, as shown in FIG. 2A, a base film 101 made of an insulating film such as a silicon oxide film, a silicon nitride film, or a silicon nitride oxide film, is formed on a substrate 100 made from a glass such as barium borosilicate glass or aluminum borosilicate glass, typically a glass such as Corning Corp. #7059 glass or #1737 glass. For example, a lamination film of a silicon nitride oxide film 101a, manufactured from $SiH_4$, $NH_3$, and $N_2O$ by plasma CVD, and formed having a thickness of 10 to 200 nm (preferably between 50 and 100 nm), and a hydrogenated silicon nitride oxide film 101b, similarly manufactured from $SiH_4$ and $N_2O$, and formed having a thickness of 50 to 200 nm (preferably between 100 and 150 nm), is formed. A two layer structure is shown for the base film 101 in Embodiment 1, but a single layer film of an insulating film and a structure in which more than two layers are laminated, may also be formed.

Island shape semiconductor layers 102 to 106 are formed by crystalline semiconductor films manufactured from a semiconductor film having an amorphous structure using a laser crystallization method or a known thermal crystallization method. The thickness of the island shape semiconductor layers 102 to 106 may be formed from 25 to 80 nm (preferably between 30 and 60 nm). There are no limitations placed on the crystalline semiconductor film material, but it is preferable to form the crystalline semiconductor films by silicon or a silicon germanium (SiGe) alloy.

A laser such as a pulse emission type or continuous emission type excimer laser, a YAG laser, or a $YVO_4$ laser can be used as a laser light source used in manufacturing the crystalline semiconductor films by the laser crystallization method. A method of condensing laser light emitted from a laser emission device into a linear shape by an optical system and then irradiating the light to the semiconductor film may be used when these types of lasers are used. The crystallization conditions may be suitably selected by the operator, but when using the excimer laser, the pulse emission frequency is set to 30 Hz, and the laser energy density is set form 100 to 400 mJ/cm$^2$ (typically between 200 and 300 mJ/cm$^2$). Further, when using the YAG laser, the second harmonic is used and the pulse emission frequency is set from 1 to 10 KHz, and the laser energy density may be set from 300 to 600 mJ/cm$^2$ (typically between 350 and 500 mJ/cm$^2$). The laser light condensed into a linear shape with a width of 100 to 1000 μm, for example 400 μm, is then irradiated over the entire surface of the substrate. This is performed with an overlap ratio of 80 to 98% for the linear laser light.

A gate insulating film 107 is formed covering the island shape semiconductor layers 102 to 106. The gate insulating film 107 is formed of an insulating film containing silicon with a thickness of 40 to 150 nm by plasma CVD or sputtering. A 120 nm thick silicon nitride oxide film is formed in Embodiment 1. The gate insulating film is not limited to this type of silicon nitride oxide film, of course, and other insulating films containing silicon may also be used in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 W/cm$^2$. Good characteristics as a gate insulating film can be obtained by subsequently performing thermal annealing, at between 400 and 500° C., of the silicon oxide film thus manufactured.

A first conductive film 108 and a second conductive film 109 are then formed on the gate insulating film 107 in order to form gate electrodes. The first conductive film 108 is formed of a Ta film with a thickness of 50 to 100 nm, and the second conductive film is formed of a W film having a thickness of 100 to 300 nm, in Embodiment 1.

The Ta film is formed by sputtering, and sputtering, of a Ta target is performed by Ar. If appropriate amounts of Xe and Kr are added to Ar at the time of sputtering, the internal stress of the formed Ta film is relaxed, and film peeling can be prevented. The resistivity of an α phase Ta film is on the order of 20 μΩcm, and it can be used in the gate electrode, but the resistivity of a β phase Ta film is on the order of 180 μΩcm and it is unsuitable for the gate electrode. The a phase Ta film can easily be obtained if a tantalum nitride film, which possesses a crystal structure similar to that of a phase Ta, is formed with a thickness of 10 to 50 nm as a base for a Ta film in order to form the α phase Ta film.

The W film is formed by sputtering with a W target, which can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 μΩcm. The resistivity can be lowered by enlarging the crystals of the W film, but for cases in which there are many impurity elements such as oxygen within the W film, crystallization is inhibited, and the film becomes high resistance. A W target having a purity of 99.9999% or 99.99% is thus used in sputtering. In addition, by forming the W film while taking sufficient care that no impurities from the gas phase are introduced at the time of film formation, the resistivity of 9 to 20 μΩcm can be achieved.

Note that, although the first conductive film 108 is a Ta film and the second conductive film is a W film in Embodiment 1, the conductive films are not limited to these. Both may also be formed from an element selected from the group consisting of Ta, W, Ti, Mo, Al, and Cu, from an alloy material having one of these elements as its main constituent, and a chemical compound of these elements. Further, a semiconductor film, typically a polysilicon film into which an impurity element such as phosphorous is doped, may also be used. Examples of preferable combinations other than that used in Embodiment 1 include: forming the first conductive film by tantalum nitride (TaN) and combining it with the second conductive film formed from a W film: forming the first conductive film by tantalum nitride (TaN) and combining it with the second conductive film formed from an Al film; and forming the first conductive film by tantalum nitride (TaN) and combining it with the second conductive film formed from a Cu film.

Masks 110 to 117 are formed next from resist, and a first etching process is performed in order to form electrodes and wirings. An ICP (inductively coupled plasma) etching method is used in Embodiment 1. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. In case of mixing $CF_4$ and $Cl_2$, the W film and the Ta film are etched to the approximately same level.

Edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon nitride oxide film with respect to a W film is from 2 to 4 (typically 3), and therefore approximately 20 to 50 nm of the exposed surface of the silicon nitride oxide film is etched by this over-etching process. First shape conductive layers 119 to 126 (first conductive layers 119a to 126a and second conductive layers 119b to 126b) are thus formed of the first conductive layers and the second conductive layers in accordance with the first etching process. Reference numeral 118 denotes a gate insulating film, and the regions of the gate insulating film 118 not covered by the first shape conductive layers 119 to 126 are made thinner by etching of 20 to 50 nm.

Further, the first shape conductive layers 119 to 126 are formed by etching one time in Embodiment 1, but they may also be formed by a plurality of etchings.

A first doping process is then performed, and an impurity element which imparts n-type conductivity is added. (See FIG. 2B.) Ion doping or ion injection may be performed for the method of doping. Ion doping is performed under the conditions of a dose amount of from $1 \times 10^{13}$ to $5 \times 10^{14}$ atoms/cm$^2$ and an acceleration voltage of 60 to 100 keV. A periodic table group 15 element, typically phosphorous (P) or arsenic (As) is used as the impurity element which imparts n-type conductivity, and phosphorous (P) is used here. The conductive layers 119 to 123 become masks with respect to the n-type conductivity imparting impurity element in this case, and first impurity regions 127 to 131 are formed in a self-aligning manner. The impurity element which imparts n-type conductivity is added to the first impurity regions 127 to 131 with a concentration in the range of $1 \times 10^{20}$ to $1 \times 10^{21}$ atoms/cm$^3$.

A second etching process is performed next, as shown in FIG. 2C. The ICP etching method is similarly used, a mixture of $CF_4$, $Cl_2$, and $O_2$ is used as the etching gas, and a plasma is generated by supplying a 500 W RF electric power (13.56 MHz) to a coil shape electrode at a pressure of 1 Pa. A 50 W RF electric power (13.56 MHz) is applied to the substrate side (test piece stage), and a self-bias voltage which is lower in comparison to that of the first etching process is applied. The W film is etched anisotropically under these etching conditions, and Ta (the first conductive layers) is anisotropically etched at a slower etching speed, forming second shape conductive layers 133 to 140 (first conductive layers 133a to 140a and second conductive layers 133b to 140b). Reference numeral 132 denotes a gate insulating film, and regions not covered by the second shape conductive layers 133 to 137 are additionally etched on the order of 20 to 50 nm, forming thinner regions.

Further, the second shape conductive layers 133 to 140 shown in FIG. 2C are formed by etching one time in Embodiment 1, but they may also be formed by etching twice or more. For example, after performing etching with a gas mixture of CP, and $Cl_2$, etching may then be performed using a gas mixture of $CF_4$, $Cl_2$ and $O_2$.

The etching reaction of a W film or a Ta film in accordance with a mixed gas of $CF_4$ and $Cl_2$ can be estimated from the radicals generated and from the ion types and vapor pressures of the reaction products. Comparing the vapor pressures of fluorides and chlorides of W and Ta, the W fluoride compound $WF_6$ is extremely high, and the vapor pressures of $WCl_5$, $TaF_5$, and $TaCl_5$ are of similar order. Therefore the W film and the Ta film are both etched by the $ClF_4$ and $Cl_2$ gas mixture. However, if a suitable quantity of $O_2$ is added to this gas mixture, $CF_4$ and $O_2$ react, forming CO and F, and a large amount of F radicals or F ions is generated. As a result, the etching speed of the W film having a high fluoride vapor pressure is increased. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds between the W film and the Ta film, and it becomes possible to make the etching speed of the W film larger than that of the Ta film.

A second doping process is then performed, as shown in FIG. 3A. The dose amount is made smaller than that of the first doping process in this case, and an impurity element which imparts n-type conductivity is doped under high acceleration voltage conditions. For example, doping is performed with the acceleration voltage set from 70 to 120 keV, and a dose amount of $1\times10^{13}$ atoms/cm$^3$, and a new impurity region is formed inside the first impurity region formed in the island shape semiconductor layers of FIG. 2B. The second conductive layers 133b to 137b are used as masks with respect to the impurity element, and doping is performed so as to also add the impurity element into regions under the first conductive layers 133a to 137a. Third impurity regions 141 to 145 that overlap the first conductive layers 133a to 137a, and second impurity regions 146 to 150 between the first impurity regions and the third impurity regions are thus formed. The impurity element which imparts n-type conductivity is added such that the concentration becomes from $1\times10^{17}$ to $1\times10^{19}$ atoms/cm$^3$ in the second impurity regions, and becomes from $1\times10^{16}$ to $1\times10^{18}$ atoms/cm$^3$ in the third impurity regions.

Further, an example is shown here of performing the second doping process with the resist masks as is, but the second doping process may also be performed after removing the resist masks.

Fourth impurity regions 154 to 156 added with an impurity element having a conductivity type which is the opposite of the above single conductive type impurity element, are then formed as shown in FIG. 3B in the island shape semiconductor layers 104 which form p-channel TFTs. The second conductive layer 134 is used as a mask with respect to the impurity element, and the impurity regions are formed in a self-aligning manner. The island shape semiconductor layers 103, 105, and 106, which form n-channel TFTs, are covered over their entire surface areas by resist masks 151 to 153. Phosphorous is added in differing concentration to the impurity regions 154 to 156, and ion doping is performed here using diborane ($B_2H_6$), so that boron is also added to the fourth impurity regions 154 to 156 with a concentration of $2\times10^{20}$ to $2\times10^{21}$ atoms/cm$^3$. In practice, the boron contained in the fourth impurity regions is influenced by the film thickness of the conductive layers which have a tapered shape and the insulating film in positions above the semiconductor layers, similar to the second doping process, and the concentration of the impurity element added into the fourth impurity regions also changes.

Impurity regions are formed in the respective island shape semiconductor layers by the above processes. The second conductive layers 133 to 136 overlapping the island shape semiconductor layers function as gate electrodes. Further, reference numeral 139 denotes the regions functioning as the island shape source wirings, reference numeral 140 denotes the regions functioning as the gate wirings, and reference numeral 137 denotes the regions functioning as the capacitor wirings.

A process of activating the impurity elements added to the respective island shape semiconductor layers is then performed, as shown in FIG. 3C, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 1. However, for cases in which the wiring material used in the wirings 133 to 140 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

A first interlayer insulating film 157 is formed next of a silicon nitride oxide film having a thickness of 100 to 200 nm. A second interlayer insulating film 158 made of an organic insulating material is then formed on the first interlayer insulating film 157. Etching is then performed in order to form contact holes.

Source wirings 159 to 161 for forming contacts with source regions, and drain wirings 162 to 164 for forming contacts with drain regions, of the island shape semiconductor layers in a driver circuit 406 are then formed. Further, in a pixel portion 407, pixel electrodes 166 and 167, and a connection electrode 165 are formed. (See FIG. 4.) An electrical connection is made, in accordance with the connection wiring 165, between the island shape source wiring 139 and the adjacent island shape source wiring 207 and a pixel TFT 404. The pixel electrode 160 forms electrical connections with the island shape semiconductor layer corresponding to the active layer of the pixel TFT (corresponding to the first semiconductor layer 201 in FIG. 1) and the island shape semiconductor layer forming a storage capacitor (corresponding to the second semiconductor layer 202 in FIG. 1). Note that the pixel electrode 167 is shared between adjacent pixels.

The driver circuit 406 having an n-channel TFT 401, a p-channel TFT 402, and an n-channel TFT 403; and the pixel portion 407 having the pixel TFT 404 and a storage capacitor 405 can thus be formed on the same substrate. For convenience, this type of substrate is referred to as an active matrix substrate throughout this specification.

The n-channel TFT 401 of the driver circuit 406 has: a channel forming region 168; the third impurity region 146 overlapping the second conductive layer 133, which forms a gate electrode, (GOLD region); the second impurity region 141 formed outside the gate electrode (LDD region); and the first impurity region 127 which functions as a source region or a drain region. The p-channel TFT 402 has: a channel forming region 169; the fourth impurity region 156 overlapping the second conductive layer 134, which forms a gate electrode; the fourth impurity region 155 formed outside the gate electrode; and the fourth impurity region 154 which functions as a source region or a drain region. The n-channel TFT 403 has: a channel forming region 170; the third impurity region 148 overlapping the second conductive layer 135, which forms a gate electrode, (GOLD region); the second impurity region 143 formed outside the gate electrode (LDD region); and the first impurity region 129 which functions as a source region or a drain region.

The pixel TFT 404 of the pixel portion has: a channel forming region 171; the third impurity region 149 overlapping the second conductive layer 136, which forms a gate electrode, (GOLD region); the second impurity region 144 formed outside the gate electrode (LDD region); and the first impurity region 130 which functions as a source region or a drain region. Further, an impurity element which imparts n-type conductivity is added: to the semiconductor layer 131, which functions as one electrode of the storage capacitor 405, at the same concentration as in the first impurity regions; to the semiconductor layer 145 at the same concentration as in the third impurity regions; and to the semiconductor layer 150 at the same concentration as in the second impurity regions. The storage capacitor is formed by the semiconductor layers, the capacitor wiring 137, and an insulating layer therebetween (the same layer as the gate insulating film). Further, an impurity element which imparts n-type conductivity is added. Note that the storage capacitor 405 shown in FIG. 4 shows a storage capacitor of an adjacent pixel.

Figure 4:
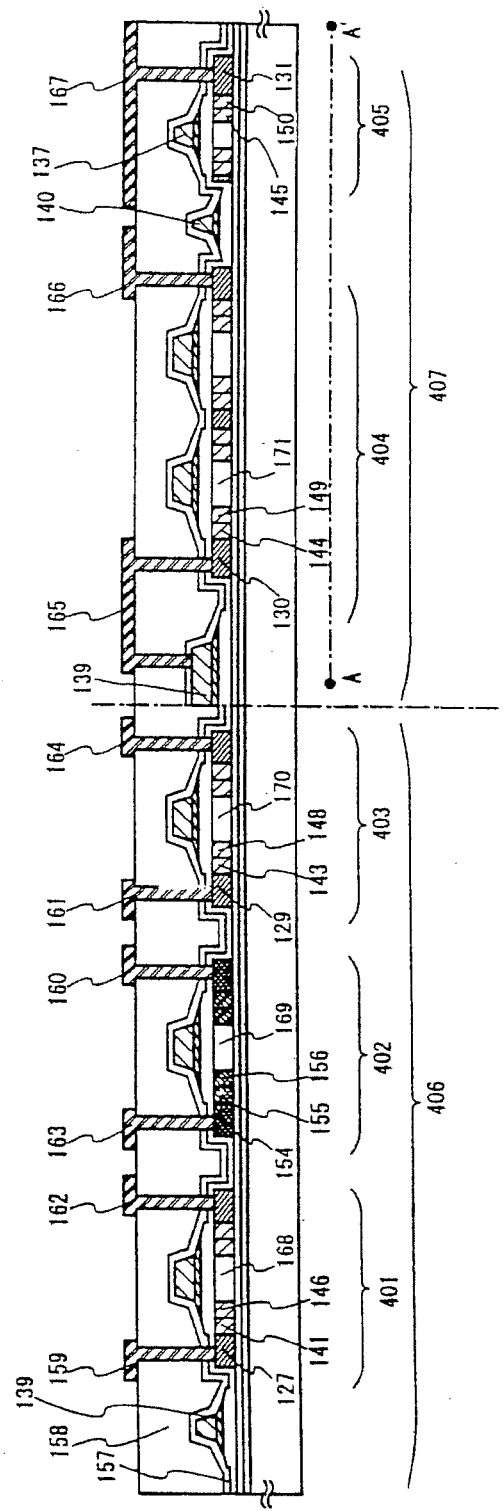
FIG. 4 is a diagram showing the process of manufacturing the active matrix substrate (Embodiment 1)

A top view of the pixel portion of the active matrix substrate manufactured by Embodiment 1 is shown in FIG. 1 and the line A-A' of FIG. 4 corresponds to the Line is A-A' shown in FIG. 1. Namely, the island shape source wiring 139, the connection electrode 165, the pixel electrodes 160 and 167, the gate wiring 140, the gate electrode 136, and the capacitor wiring 137 shown in FIG. 4 are denoted by the same reference numerals as those in FIG. 1.

As described above, the source wirings and the connection electrodes are formed by differing layers, pixel electrodes having a large surface area can be arranged by using the pixel structure shown in FIG. 1, and the aperture ratio can thus be increased for an active matrix substrate having the pixel structure of the present invention.

Further, with the pixel structure of the present invention, source wirings and gate wirings are arranged so as to overlap in edge portions of the pixel electrodes such that the gaps between the pixel electrodes can be shielded from light without using a black matrix.

Furthermore, in accordance with the processes shown in Embodiment 1, the active matrix substrate can be manufactured by using five photomasks (an island shape semiconductor layer pattern, a first wiring pattern (gate wirings, island shape source wirings, capacitor wirings), an n-channel region mask pattern, a contact hole pattern and a second wiring pattern (including pixel electrodes and connection electrodes). As a result, the processes can be reduced, and this contributes to a reduction in the manufacturing costs and an increase in throughput.

Embodiment 2

Figure 5:
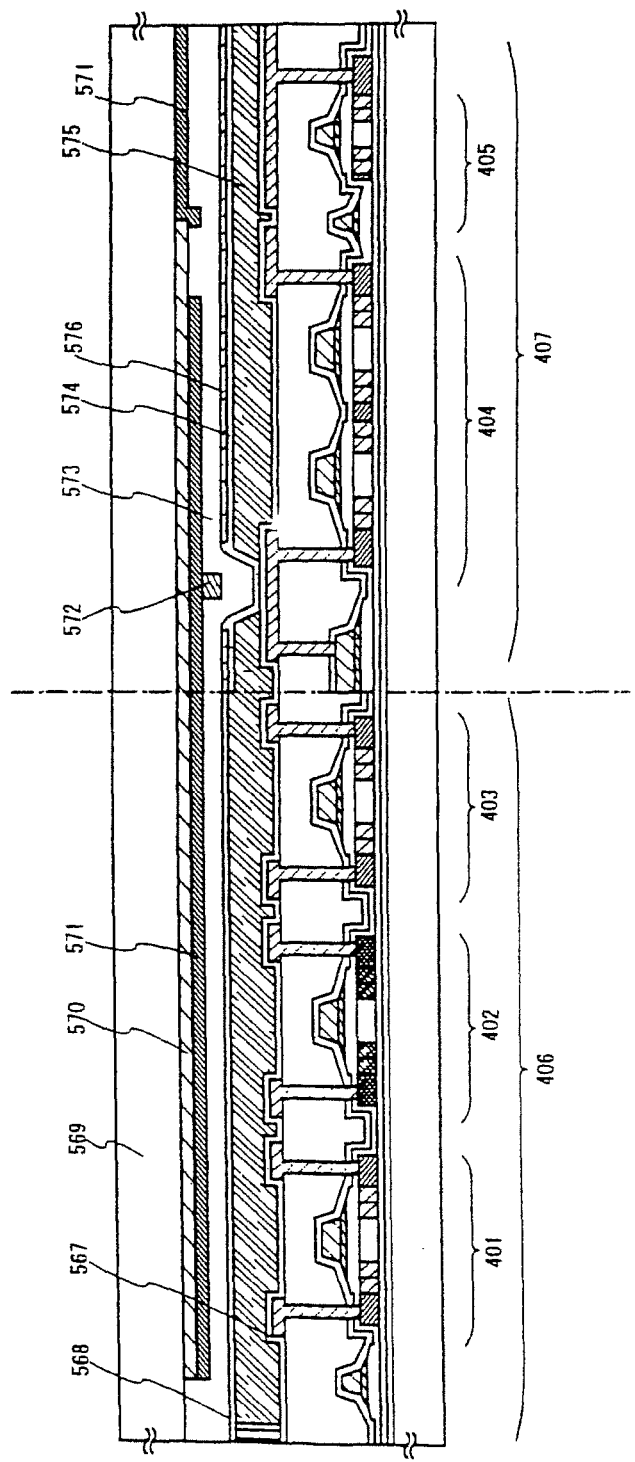
FIG. 5 is a diagram showing a cross sectional structure of an active matrix liquid crystal display device.

A process of manufacturing an active matrix liquid crystal display device from the active matrix substrate manufactured in Embodiment 1 is explained below in Embodiment 2. FIG. 5 is used for the explanation.

After first obtaining the active matrix substrate of FIG. 4 in accordance with Embodiment 1, an orientation film 567 is formed on the active matrix substrate of FIG. 4, and a rubbing process is performed.

An opposing substrate 569 is prepared. Color filter layers 570 and 571, and an overcoat layer 573 are formed on the opposing substrate 569. The color filter layers are formed such that the color filter layer 570, having a red color, and the color filter 571, having a blue color, are overlapped with each other, and also serve as a light shielding film. It is necessary to shield at least the spaces between the TFTs, and the connection electrodes and the pixel electrodes when using the substrate of Embodiment 1, and therefore, it is preferable that the red color filters and the blue color filters are arranged so as to overlap and shield the necessary positions.

Further, combined with the connection electrode 165, the red color filter layer 570, the blue color filter layer 571, and a green color filter layer 572 are overlaid, forming a spacer. Each color filter is formed having a thickness of 1 to 3 μm by mixing a pigment into an acrylic resin. A predetermined pattern can be formed using a mask which uses a photosensitive material. Considering the thickness of the overcoat layer of 1 to 4 μm, the height of the spacers can be made from 2 to 7 μm, preferably between 4 and 6 μm. A gap is formed by this height when the active matrix substrate and the opposing substrate are joined together. The overcoat layer is formed by an optical hardening, or a thermosetting, organic resin material, and materials such as polyimide and acrylic resin are used, for example.

The arrangement of the spacers may be determined arbitrarily, and the spacers may be arranged on the opposing substrate so as to line up with positions over the connection electrodes, as shown in FIG. 5, for example. Further, the spacers may also be arranged on the opposing substrate so as to line up with positions over the TFTs of the driver circuit. The spacers may be arranged over the entire surface of the driver circuit portion, and they may be arranged so as to cover source wirings and drain wirings.

An opposing electrode 576 is formed by patterning after forming the overcoat layer 573, and a rubbing process is performed after forming an orientation film 574.

The active matrix substrate on which the pixel portion and the driver circuit are formed, and the opposing substrate are then joined together by a sealant 568. A filler is mixed into the sealant 568, and the two substrates are joined together with a uniform gap maintained by the filler and the spacers. A liquid crystal material is then injected between both the substrate, and this is completely sealed by using a sealing material (not shown in the figure). A known liquid crystal material may be used as the liquid crystal material. The active matrix liquid crystal display device shown in FIG. 5 is thus completed.

Embodiment 3

Figure 6:
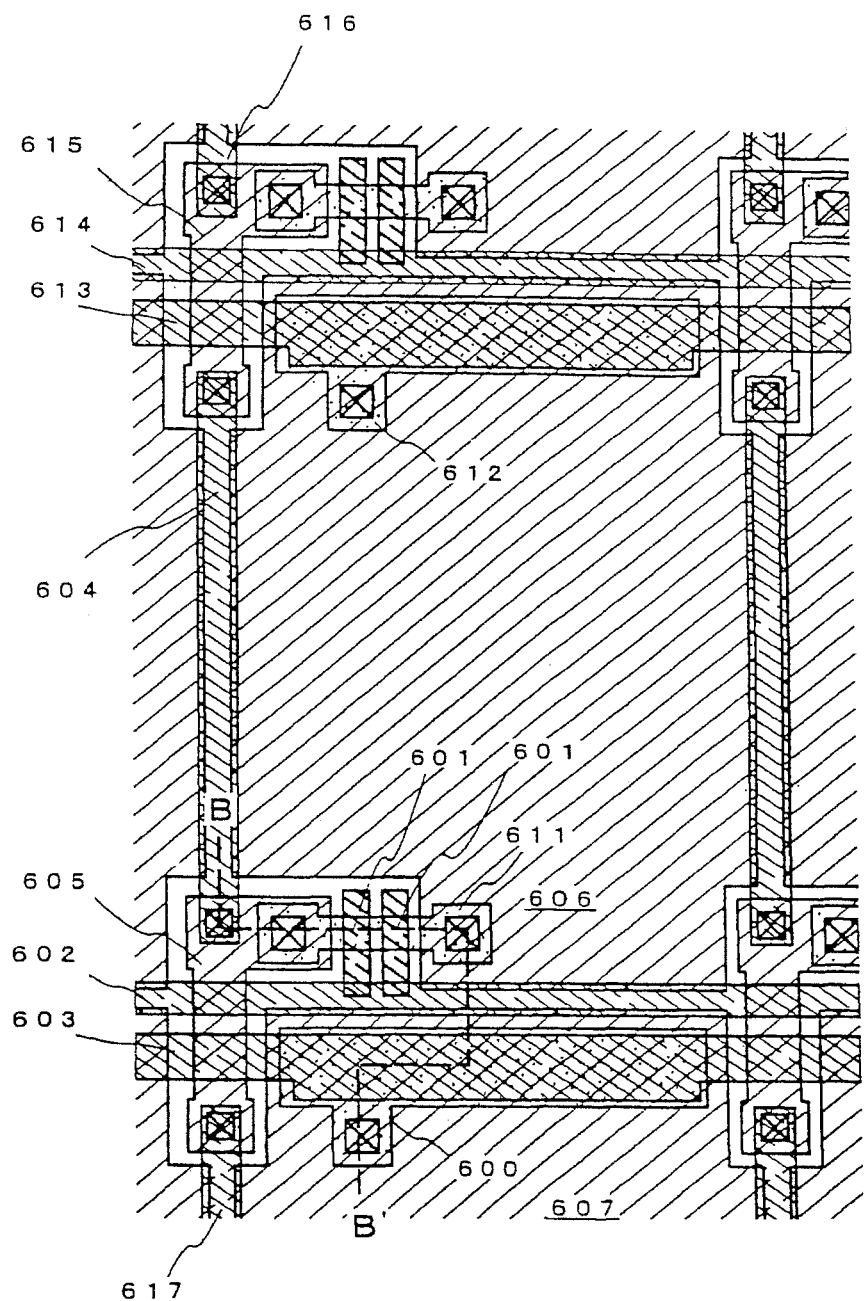
FIG. 6 is a top view of a pixel portion of the present invention (Embodiment 3)
Figure 7:
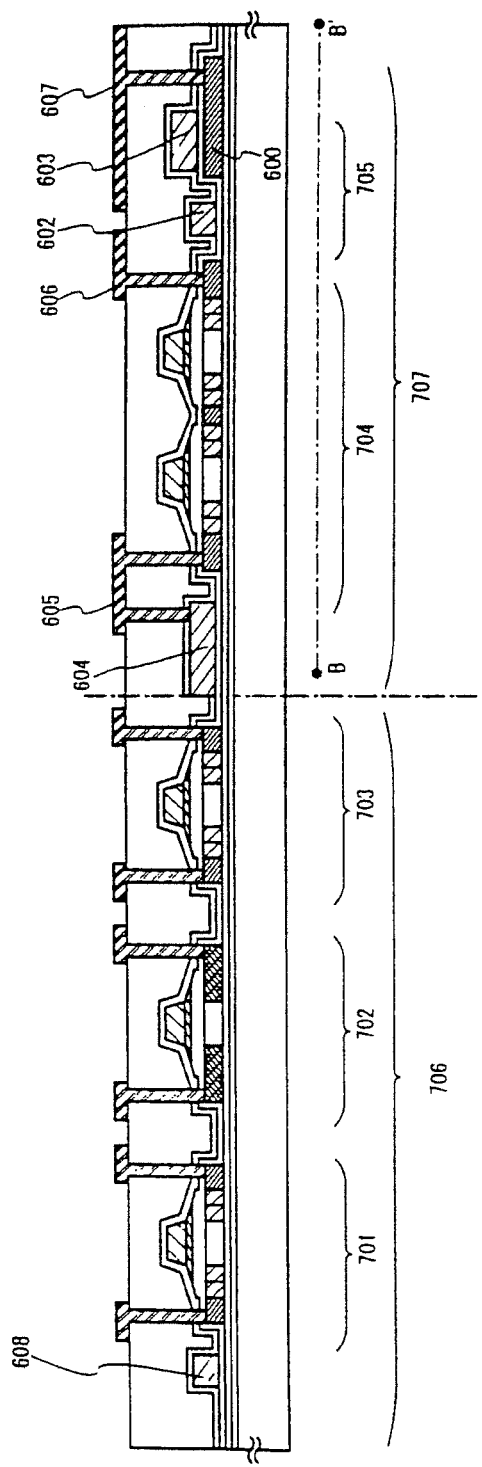
FIG. 7 is a diagram showing a cross section of an active matrix substrate (Embodiment 3)

An example of forming gate wirings, island shape source wirings, and capacitor wirings at the same time is shown in Embodiment 1. However, in Embodiment 3, an example of manufacturing an active matrix substrate in which the number of masks is increased by one and a process for forming gate electrodes, and a process for forming gate wirings, source wirings, and capacitor wirings, are performed separately is shown in FIG. 6 and FIG. 7.

The gate electrodes of the TFTs shown in Embodiment 1 have a two layer structure. Both the first layer and the second layer are formed from an element selected from the group consisting of Ta, W, Ti, Mo, Al, and Cu, an alloy material having one of the elements as its main constituent, and a chemical compound of the elements. Alternatively, the first layer may be formed of a semiconductor film, typically a polysilicon film doped with an impurity element such as phosphorous.

Similar to a case of using a semiconductor film in the first layer of the gate electrodes, the surface resistance of an element selected from the group consisting of Ta, W, Ti, and Mo, or of an alloy material having one of the elements as its main constituent, and a chemical compound material of the elements, has a value of approximately 10Ω or higher, and this is not necessarily suitable for a case of manufacturing a display device having a screen size in the 4 inch class or greater. With the increase in screen size, the extraction length of the wirings naturally increases, and it becomes impossible to ignore the problem of a signal delay time due to influence of the wiring resistance. Further, if the wirings are formed having a large width with the aim of lowering the wiring resistance, the surface area of a peripheral region outside the pixel portion increases, and the external appearance of the display device is remarkably marred.

The gate wirings and the capacitor wirings are therefore formed from a material having low sheet resistance value aluminum (Al) or copper (Cu) as its main constituent in Embodiment 3. In other words, the gate wirings are formed with a different material from the gate electrodes.

A contact portion between a gate wiring 602 and a gate electrode 601 is formed outside a semiconductor layer, as shown in FIG. 6. Al exudes into a gate insulating film by phenomena such as electromigration, and therefore it is not suitable to form the gate wirings on the semiconductor layer. It is hot necessary to form contact holes for the contact, and the gate electrodes and the gate wirings may be formed to overlap with each other.

A process of manufacturing is shown in brief below.

First, in accordance with Embodiment 1, the same processes are performed up through the activation and hydrogenation processes. However, in Embodiment 1, the electrodes and wirings denoted by reference numerals 133 to 137 are manufactured simultaneously, but in Embodiment 3, only gate electrodes 601 of respective TFTs are formed. Note that an impurity element which imparts n-type conductivity is added to second semiconductor layers 600 and 612, which become one electrode of a storage capacitor, at the same concentration as in first impurity regions.

Next, after performing the activation process, gate wirings 602 and 614, island shape source wirings 604, 616, and 617, capacitor wirings 603 and 613, and a driver circuit wiring 608 are formed from a low resistance conductive material. The low resistance conductive material is a material having Al or Cu as its main constituent and the gate wirings are formed by this type of material. An example of using Al is shown in Embodiment 3, and an Al film containing from 0.1 to 2 wt % of Ti may be formed over the entire surface as the low resistance conductive layer (not shown in the figures). The low resistance conductive layer is formed with a thickness of 200 to 400 nm (preferably between 250 and 350 nm). A predetermined resist pattern is then formed and an etching process is performed, forming the gate wirings 602 and 614, the island shape source wirings 604, 616, and 617, the capacitor wirings 603 and 613, and the driver circuit wiring 608. The wirings can be formed while maintaining selective fabricability with the base if wet etching is performed, using a phosphate etching solution, as the etching process.

A first interlayer insulating film and a second interlayer insulating film are formed next, in accordance with Embodiment 1. Source wirings for forming contacts with source regions of island shape semiconductor layers, and drain wirings for forming contacts with drain regions, are then formed in a driver circuit 706. Further, pixel electrodes 606 and 607, and connection electrodes 605 and 615, are formed in a pixel portion 707. (See FIG. 7.) An electrical connection is made, in accordance with the connection electrode 605, between the island shape source wiring 604 and the adjacent island shape source wiring 617 and a pixel TFT 704. Note that a storage capacitor 705 and the pixel electrode 607 are shared between adjacent pixels. Further, an impurity element which imparts n-type conductivity is added to the second semiconductor layer 600, which functions as one electrode of the storage capacitor 705, at the same concentration as in the first impurity regions. The storage capacitor is formed by the second semiconductor layer 600, the capacitor wiring 603, and an insulating layer therebetween (the same layer as the gate insulating film).

The driver circuit 706 having an n-channel TFT 701, a p-channel TFT 702, and an n-channel TFT 703; and the pixel portion 707 having the pixel TFT 704 and the storage capacitor 705 can thus be formed on the same substrate.

FIG. 6 is a top view of the pixel portion of the active matrix substrate manufactured in Embodiment 3, and the dotted line B-B' of FIG. 6 corresponds to the line B-B' shown in the cross sectional view of FIG. 7.

In accordance with Embodiment 3, the wiring resistance can be sufficiently reduced by forming the gate wirings 602 and 614, the island shape source wirings 604, 616, and 617, and the capacitor wirings 603 and 613 by using a low resistance conductive material, and a superior display device having a pixel portion (screen size) of 4 inches or greater can be realized in combination with Embodiment 2.

Embodiment 4

Figure 8:
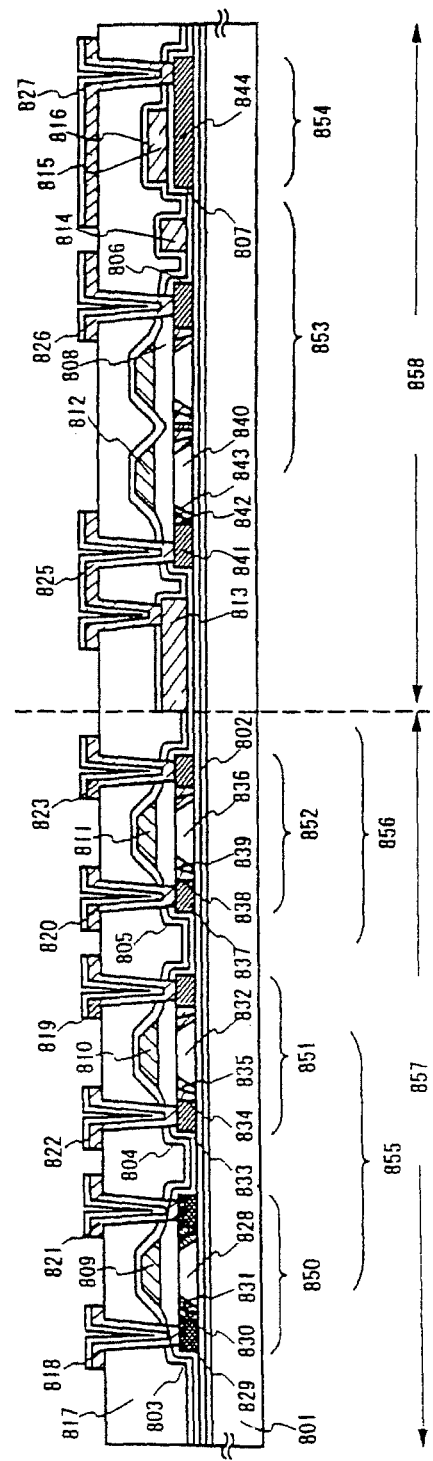
FIG. 8 is a diagram showing a cross section of an active matrix substrate (Embodiment 4)

An example in which a TFT structure of an active matrix substrate differs from that of Embodiment 3 is explained in Embodiment 4 with reference to FIG. 8.

A driver circuit 857 having a logic circuit 855 containing a first p-channel TFT 850 and a second n-channel TFT 851, and a sampling circuit 856 made from a second n-channel TFT 852; and a pixel portion 858 having a pixel TFT 853 and a storage capacitor 854, are formed on the active matrix substrate shown in FIG. 8. The TFT of the logic circuit 855 of the driver circuit 857 forms a circuit such as a shift register circuit or a buffer circuit, and the TFT of the sampling circuit 856 basically forms an analog switch.

The TFTs are formed by forming regions such as channel forming regions, source region, drain regions, and LDD regions in island shape semiconductor layers 803 to 806 on a base film 802 formed on a substrate 801. The base film and the island shape semiconductor layers are formed similar to those in Embodiment 1. Gate electrodes 809 to 812 formed on a gate insulating film 808 are formed having a tapered shape in their edge portions, and LDD regions are formed using these portions. This type of tapered shape can be formed by an anisotropic etching technique of a W film using an ICP etching apparatus, similar to Embodiment 1.

The LDD regions formed utilizing the tapered portions are formed in order to increase reliability of n-channel TFTs, and on-current degradation due to the hot carrier effect is prevented by the LDD regions. Regarding the LDD regions, ions of a suitable impurity element are accelerated by an electric field and added to semiconductor films through edge portions of the gate electrode, and through the gate insulating film in the vicinity of the edge portions, by ion doping method.

A first LDD region 835, a second LDD region 834, and a source/drain region 833 are formed outside a channel forming region 832 in the first n-channel TFT 851, and the first LDD region 835 is formed so as to overlap the gate electrode 810. Further, an impurity element which imparts n-type conductivity and is contained in the first LDD region 835 and the second LDD region 834 is higher in the second LDD region 834 due to the difference in the film thickness of the upper layer gate insulating film and the gate electrode. The second n-channel TFT 852 is also formed having a similar structure, and is composed of a channel forming region 836, a first LDD region 839 overlapping the gate electrode, a second LDD region 838, and a source/drain region 837. On the other hand, the p-channel TFT 850 has a single drain structure, and impurity regions 829 to 831, in which a p-type impurity is added to the outside of a channel forming region 828, are formed.

The pixel TFT formed of an n-channel TFT in the pixel portion 858 is formed by a multi-gate structure with the aim of reducing the off current, and a first LDD region 843 overlapping the gate electrode, a second LDD region 842, and a source/drain region 841 are formed outside a channel forming region 840. Further, the storage capacitor 854 is formed from an island shape semiconductor layer 807, an insulating layer formed from the same layer as the gate insulating film 808, and a capacitor wiring 815. An n-type impurity is added to the island shape semiconductor layer 807, and the voltage applied to the capacitor wiring can be made lower due to the low resistivity.

An interlayer insulating film is formed of a first interlayer insulating film 816 having a thickness of 50 to 500 nm and made from an inorganic material such as silicon oxide, silicon nitride, or silicon nitride oxide, and a second interlayer insulating film 817 made from an organic insulating material such as polyimide, acrylic, polyimide amide, or BCB (benzocyclobutene). A well leveled surface can thus be obtained by forming the second interlayer insulating film with an organic insulating material. Further, organic resin materials generally have low dielectric constants, and therefore parasitic capacitance can be reduced. However, organic resin materials are hygroscopic and not suitable as protective films. It is therefore preferable to form the second interlayer insulating film in combination with the first interlayer insulating film 816.

A resist mask having a predetermined pattern is formed next, and contact holes for reaching source regions or drain regions of the respective island shape semiconductor layers are formed. The contact holes are formed by dry etching. A mixed gas of $CF_4$, $O_2$, and He is used as an etching gas in this case, and the interlayer insulating film made from the organic resin material is etched first. The protecting insulating film 816 is etched next with $CF_4$ and $O_2$ as an etching gas. In addition, by switching the etching gas to $CHF_3$ in order to increase the selectivity with respect to the island shape semiconductor layers, the gate insulating film is etched. Thus, good contact holes can be formed.

A conductive metallic film is then formed by sputtering or vacuum evaporation, a resist mask pattern is formed, and source and drain wirings 818 to 823, pixel electrodes 826 and 827, and a connection electrode 825 are formed by etching. An active matrix substrate having the pixel portion with the pixel structure as shown in FIG. 1 can thus be formed. Furthermore, the active matrix liquid crystal display device shown in Embodiment 2 can be manufactured by using the active matrix substrate of Embodiment 4.

Embodiment 5

Figure 9:
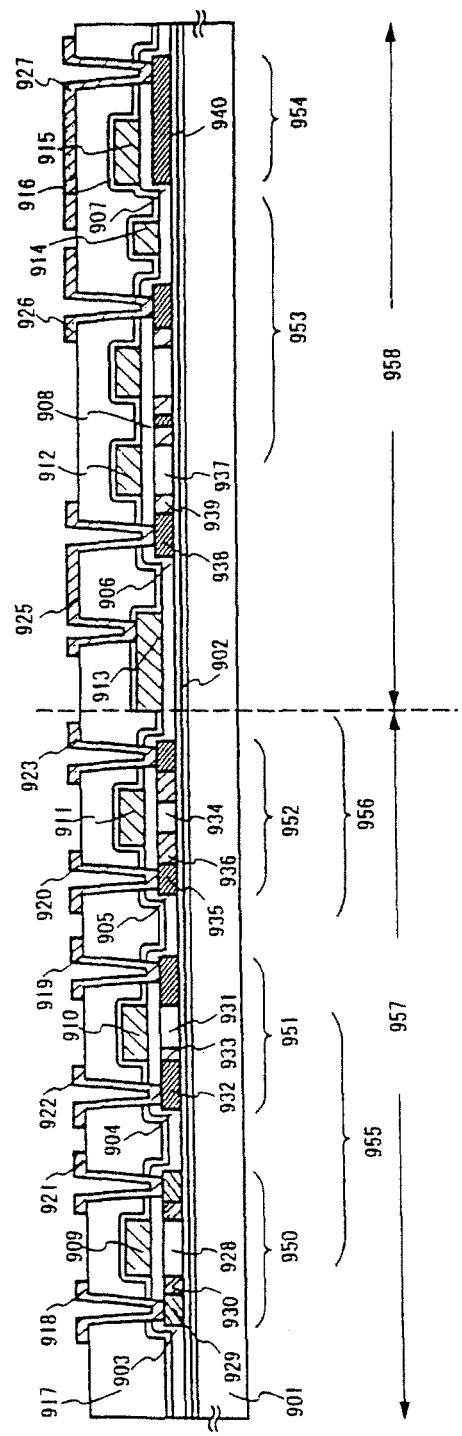
FIG. 9 is a diagram showing a cross section of an active matrix substrate (Embodiment 5)

Another example in which a TFT structure of an active matrix substrate differs from that of Embodiment 3 is explained in Embodiment 5 with reference to FIG. 9.

A driver circuit 957 having a logic circuit 955 comprising a first p-channel TFT 950 and a second n-channel TFT 951, and a sampling circuit 956 formed of a second n-channel TFT 952; and a pixel portion 958 having a pixel TFT 953 and a storage capacitor 954, are formed on the active matrix substrate shown in FIG. 9. The TFT of the logic circuit 955 of the driver circuit 957 forms a circuit such as a shift register circuit or a buffer circuit, and the TFT of the sampling circuit 956 basically forms an analog switch.

For the active matrix substrate shown in Embodiment 5, a base film 902 is first formed on a substrate 901, of a film such as a silicon oxide film or a silicon nitride oxide film, having a thickness of 50 to 200 nm. Island shape semiconductor layers 903 to 907 are formed next from a crystalline semiconductor film manufactured by laser crystallization or thermal crystallization. A gate insulating film 908 is formed on the island shape semiconductor layers. An impurity element which imparts n-type conductivity, typically phosphorous (P) is then selectively added to the island shape semiconductor layers 904 and 905, which form n-channel TFTs, and to the semiconductor layer 907, which forms a storage capacitor, at a concentration of $1\times10^{16}$ to $1\times10^{19}$ atoms/cm$^3$.

Gate electrodes 909 to 912, a gate wiring 914, a capacitor wiring 915, and a source wiring 913 are formed by a material having W or Ta as a constituent. The gate wiring, the capacitor wiring, and the source wiring may also be separately formed by a material having a low resistivity such as Al as in Embodiment 3. An impurity element which imparts n-type conductivity, typically phosphorous (P) is then selectively added at a concentration of $1\times10^{19}$ to $1\times10^{21}$ atoms/cm$^3$ to regions outside the island shape semiconductor layers 903 to 907, outside the gate electrodes 909 to 912, and outside the capacitor wiring 915. Channel forming regions 931 and 934, LDD regions 933 and 936, and source/drain regions 932 and 935 are thus formed in the first n-channel TFT 951 and in the second n-channel TFT 952, respectively. An LDD region 939 of the pixel TFT 953 is formed in a self-aligning manner using the gate electrode 912, and is formed outside a channel forming region 937. A source/drain region 938 is formed similar to the first and the second n-channel TFTs.

An interlayer insulating film is formed, similar to Embodiment 3, of a first interlayer insulating film 916 made from an inorganic material such as silicon oxide, silicon nitride, or silicon nitride-oxide, and a second interlayer insulating film 917 made from an organic insulating material such as polyimide, acrylic, polyimide amide, or BCB (benzocyclobutene). A resist mask having a predetermined pattern is formed next, and contact holes for teaching source regions or drain regions formed in the respective island shape semiconductor layers are formed. A conductive metallic film is then formed by sputtering or vacuum evaporation, and source wirings and drain wirings 918 to 923, pixel electrodes 926 and 927, and a connection electrode 925 are formed. An active matrix substrate having the pixel portion with the pixel structure shown in FIG. 1 can thus be formed. Further, the active matrix liquid crystal display device shown in Embodiment 2 can also be manufactured using the active matrix substrate of Embodiment 5.

The first n-channel TFT 951 of the logic circuit 955 has a structure in which a GOLD region overlapping the gate electrode is formed on the drain side. High electric field regions generated in the vicinity of the drain region are relieved by the GOLD region, hot carrier generation is prevented, and degradation of the TFT is prevented. An n-channel TFT having this type of structure is suitable in buffer circuits and shift register circuits. On the other hand, the second n-channel TFT 952 of the sampling circuit 956 has a structure in which a GOLD region and an LDD region are formed on the source side and on the drain side, which prevents deterioration due to hot carriers in an analog switch that operates by polarity inversion. In addition, this structure aims to reduce the off current. The pixel TFT 953 has an LDD structure, and is formed by multiple gates, and a structure thereof aims to reduce the off current. On the other hand, the p-channel TFT is formed with a single drain structure: and impurity regions 929 and 930, into which a p-type impurity element is added, are formed outside a channel forming region 928.

The TFTs structuring each circuit are thus optimized in response to the specification required by the pixel portion and the driver circuit, and the active matrix substrate shown in FIG. 9 has a structure which, in particular, is made in consideration of increasing the operating characteristics and reliability of each circuit.

Embodiment 6

Figure 11:
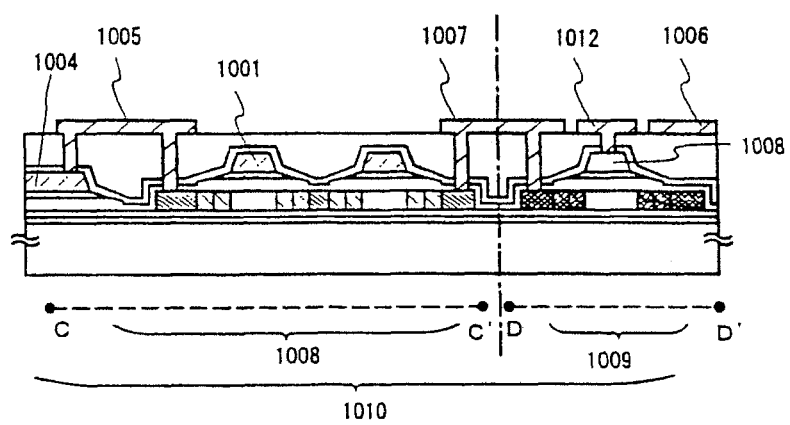
FIG. 11 is a diagram showing a cross section of the pixel portion of the present invention (Embodiment 6)

Another example of a different pixel structure of an active matrix substrate is explained in Embodiment 6 with reference to FIG. 10 and FIG. 11.

An active matrix substrate having the pixel structure shown in FIG. 10 and in FIG. 11 can be obtained in Embodiment 6 by changing only the mask patterns from that of Embodiment 1.

The manufacturing process of Embodiment 6 is substantially the same as that of Embodiment 1.

The state of FIG. 2A is formed in accordance with Embodiment 1. The mask of Embodiment 1 is then changed, and the gate electrode 1001, the capacitor electrode 1008, and the source wiring 1004 are formed by patterning.

Processing is subsequently performed in accordance with Embodiment 1 up through the state of FIG. 3A. The mask of Embodiment 1 is then changed, and an impurity element which imparts p-type conductivity is added not only to the p-channel TFT of the driver circuit, but also to the semiconductor layer which becomes one of the electrodes of the storage capacitor.

Next, in accordance with Embodiment 1, activation is performed and the formation of the first interlayer insulating film and the second interlayer insulating film is performed. The mask of Embodiment 1 is then changed, and formation of each contact hole is performed. The mask of Embodiment 1 is then changed, and the connection electrode 1005, the gate wirings 1002 and 1012, and the pixel electrodes 1006 and 1007 are formed by patterning.

The pixel structure shown in FIG. 10 is thus obtained. The gate wirings in FIG. 10 indicate connections between the island shape gate electrodes 1001 arranged in a horizontal direction and the island shape capacitor electrodes 1008. Further, the dotted line C-C' in a cross sectional view of FIG. 10 corresponds to the dotted line C-C' in FIG. 11, and the dotted line D-D' in a cross sectional view of FIG. 10 corresponds to the dotted line D-D' in FIG. 11.

The island shape gate electrode 1001 is formed on and contacting the gate insulating film at the same time as the source wiring 1004 and the capacitor electrode 1008 in Embodiment 6, as shown in FIG. 10 and in FIG. 11. Further, the gate wirings 1002 and 1012 are formed on the interlayer insulating film as the pixel electrodes 1006 and 1007, and the connection electrode 1005.

The space between respective pixels can be shielded from light mainly by the edge portion of the pixel electrode 1006 overlapping with the source wiring 1004 in accordance with the above structure.

Further, the storage capacitor of the pixel electrode 1006 is formed of the second semiconductor layer connected to the pixel electrode 1006, and the capacitor electrode 1008 connected to the gate wiring 1012, with the insulating film covering the second semiconductor layer as a dielectric.

Furthermore, it is preferable to add an impurity element which imparts p-type conductivity into the second semiconductor layer when forming this type of storage capacitor.

Note that it is possible to combine Embodiment 6 with Embodiment 2.

Embodiment 7

A structure of the active matrix liquid crystal display device obtained using Embodiment 2 (see FIG. 5) is explained with reference to the top view of FIGS. 12A and 12B. Note that portions corresponding to FIG. 5 are denoted by the same reference numerals.

Figure 12A:
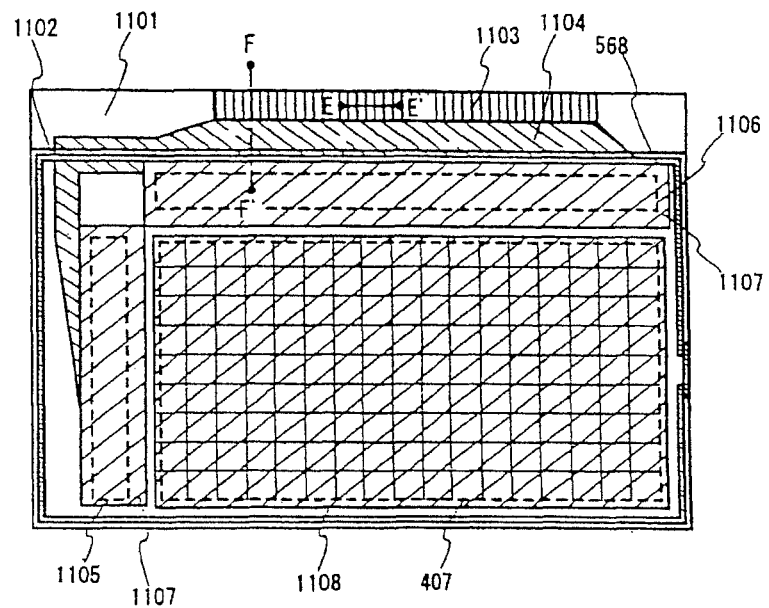
FIGS. 12A and 12B are a top view and a cross sectional view, respectively, of an active matrix liquid crystal display device (Embodiment 7)

In the top view shown in FIG. 12A, an active matrix substrate 1101 on which components such as a pixel portion, a driver circuit, an external input terminal 1103 for attaching thereto an FPC (flexible printed circuit), and a wiring 1104 for connecting the external input terminal to an input portion of each circuit are formed, and an opposing substrate on which components such as color filters are formed, are joined, sandwiching the sealant 568 in between.

A light shielding film 1107 is formed on the opposing substrate side, above a gate wiring side driver circuit 1105 and a source wiring side driver circuit 1106, from a red color filter or a lamination of a red color filter and a blue color filter. Further, regarding color filters 1108 formed on the opposing substrate side above the pixel portion 407, red, green, and blue color filter layers are formed corresponding to each pixel. Color display is achieved by three colors from a red (R) color filter, a green (G) color filter, and a blue (B) color filter when performing actual display, but the arrangement of the color filters is arbitrary.

FIG. 13 shows a cross sectional view taken along the line F-F' of the external input terminal 1103 shown in FIG. 12A. The external input terminal is formed on the active matrix substrate side, and in order to reduce interlayer capacitance and wiring resistance, and prevent defects due to broken wirings, the external input terminal is connected to a wiring 1111 formed from the same layer as the gate wiring by a wiring 1109 formed from the same layer as the pixel electrode, sandwiching an interlayer insulating film 1110 in between.

Further, an FPC composed of a base film 1112 and a wiring 1113 is joined to the external input terminal by an anisotropic conductive resin 1114. In addition, the mechanical strength is increased by a reinforcing plate 1115.

Figure 13A:
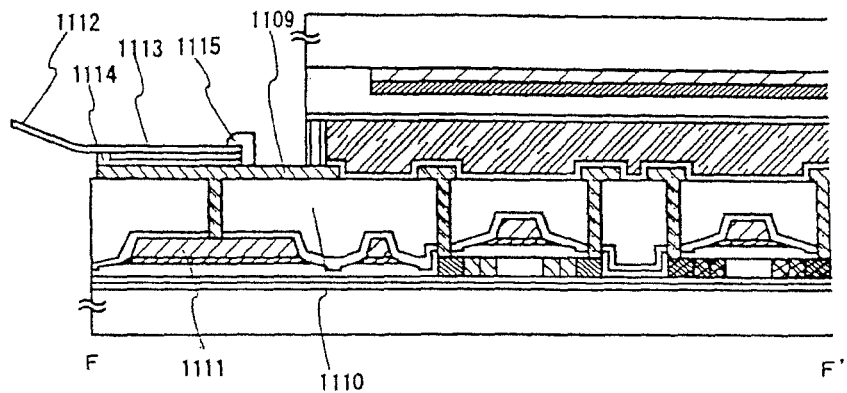
FIGS. 13A and 13B are diagrams showing cross sections of the active matrix liquid crystal display device (Embodiment 7)
Figure 13B:
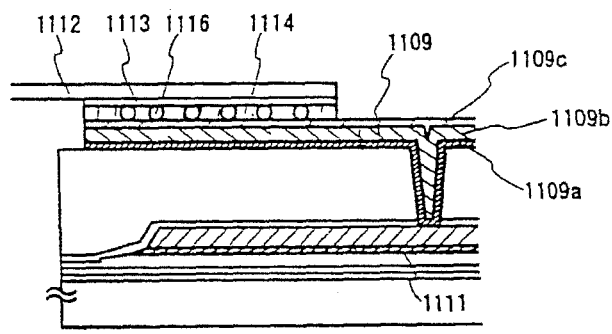

FIG. 13B shows a detailed diagram thereof, and shows a cross sectional view of the external input terminal shown in FIG. 13A. The external input terminal formed on the active matrix substrate side is composed of the wiring 1111, which is formed from the same layer as the gate wiring, and of the wiring 1109, which is formed from the same layer as the pixel electrode. Of course, this is merely an example showing the structure of a terminal portion, and the terminal portion may be formed from only one of the wirings. For example, when forming it from the wiring 1111 which is formed of the same layer as the gate wiring, it is necessary to remove the interlayer insulating film formed on the wiring 1111. The wiring 1109, which formed from the same layer as the pixel electrode, has a three layer structure of a Ti film 1109a, an Al film 1109b, and an Sn film 1109c, in accordance with the structure shown in Embodiment 1. The FPC is composed of the base film 1112 and the wiring 1113. The wiring 1113 and the wiring 1109 formed from the same layer as the pixel electrode are joined by an anisotropic conductive adhesive composed of conductive particles 1116 dispersed within a thermosetting adhesive 1114, forming an electrically connected structure.

Figure 12B:
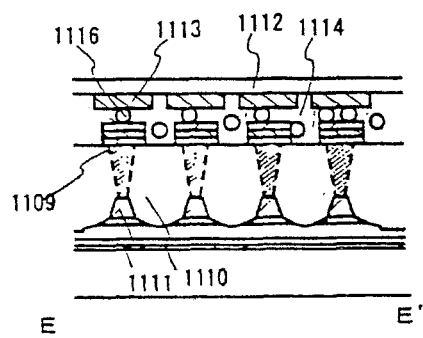

On the other hand, FIG. 12B shows a cross sectional view taken along the line E-E' of the external input terminal 1103 shown in FIG. 12A. The outer diameter of the conductive particles 1116 is smaller than the pitch of the wirings 1109, and therefore if a suitable amount is dispersed within the adhesive 1114, electrical connections with corresponding FPC side wirings can be formed without short circuits being formed between adjacent wirings.

An active matrix liquid crystal display-device thus manufactured can be used as a display unit of all types of electronic equipment.

Note that it is possible to freely combine Embodiment 7 with any one of Embodiments 3 to 6.

Embodiment 8

Embodiment 8 represents another method of fabricating the crystalline semiconductor layer for forming the semiconductor layer of the TFT of the active matrix substrate represented by Embodiment 1. In this embodiment, the crystallization method using a catalytic element, that is disclosed in Japanese Patent Laid-Open No. 7-130652, can be applied. An example of this case will be explained below.

Underlying films and an amorphous semiconductor layer are formed to a thickness of 25 to 80 nm on a glass substrate in the same way as in Embodiment 1. An amorphous silicon film, for example, is formed to a thickness of 55 nm. An aqueous solution containing 10 ppm, calculated by weight, of a catalytic element is applied by a spin coating method to form a layer containing the catalytic element. Examples of the catalytic element include nickel (Ni), germanium (Ge), iron (Fe), palladium (Pd), tin (Sn), lead (Pb), cobalt (Co), platinum (Pt), copper (Cu) and gold (Au). Besides spin coating, the layer 170 containing the catalytic element may be formed by sputtering or vacuum deposition so that the thickness of the layer of the catalytic element is 1 to 5 nm.

In the crystallization step, heat treatment is conducted first at 400 to 500° C. for is about 1 hour and the hydrogen content of the amorphous silicon film is lowered to not greater than 5 atom %. Heat annealing is then conducted in a nitrogen atmosphere at 550 to 600° C. for 1 to 8 hours inside a furnace annealing oven. This process step can acquire a crystalline semiconductor layer comprising the crystalline silicon film.

By forming the island semiconductor layers from the crystalline semiconductor layers manufactured as above mentioned, an active matrix substrate can be completed, similarly to Embodiment 1. However, in crystallization process, if a catalytic element for promoting the crystallization of silicon is used, a small amount (about $1 \times 10^{17}$ to $1 \times 10^{19}$ atoms/cm$^3$) of the catalytic element remains within the island semiconductor layers. It is, of course, possible to complete the TFT in such a state but it is preferred to remove the remaining catalytic element from at least the channel forming region. One of the means of removing this catalytic element is a means using gettering action of phosphorous (P).

A gettering treatment with phosphorus (P) for this purpose can be conducted simultaneously with the activation step explained in FIG. 3C. The concentration of phosphorus (P) necessary for gettering may be approximate to the impurity concentration of the high concentration n-impurity region. Thermal annealing of the activation step can allow the catalytic element to segregate from the channel formation region of the n-channel TFT and the p-channel TFT to the impurity region containing phosphorus (P) in that concentration. As a result, the catalytic element segregates in a concentration of $1 \times 10^{17}$ to $1 \times 10^{19}$ atoms/cm$^3$ in the impurity region. The TFT thus fabricated has a lowered OFF current value and has high crystallinity. Therefore, a high field effect mobility can be obtained, and excellent characteristics can be accomplished.

This embodiment can be freely combined with one of the structure of Embodiments 1 to 7.

Embodiment 9

The CMOS circuit and the pixel portion in accordance with the present invention can be used for various electro-optical apparatuses (the active matrix type liquid crystal display device and the active matrix type EC display device). Therefore the present invention can be applied to all those electronic apparatuses which include such an electro-optical apparatuses.

The following can be given as such electronic apparatuses: a video camera, a digital camera, a projector (rear type or front type), a head-mounted display (a goggle type display), a car navigation system, a car stereo, a personal computer, and a portable information terminal (such as a mobile computer, a portable telephone or an electronic book). Examples of these are shown in FIGS. 14 and 15.

Figure 14A:
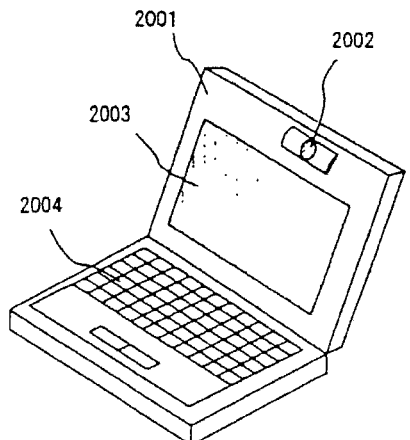
FIGS. 14A to 14F are diagrams showing examples of electronic equipment (Embodiment 9)

FIG. 14A is a personal computer, and it includes a main body 2001, an image input portion 2002, a display portion 2003, and a keyboard 2004, etc. The present invention can be applied to the image input portion 2002, the display portion 2003 or other driver circuits.

Figure 14B:
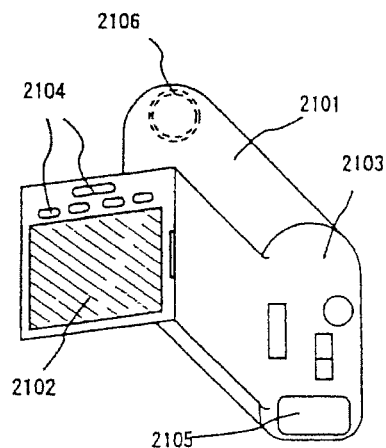

FIG. 14B is a video camera, and it includes a main body 2101, a display portion 2102, an audio input portion 2103, operation switches 2104, a battery 2105, and an image receiving portion 2106, etc. The present invention can be applied to the display portion 2102 or other driver circuits.

Figure 14C:
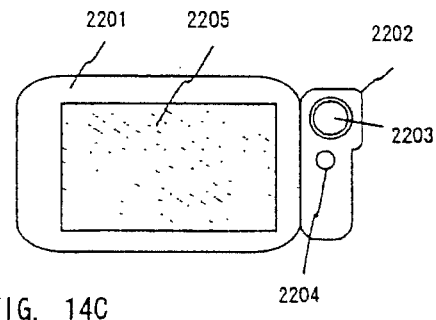

FIG. 14C is a mobile computer, and it includes a main body 2201, a camera portion 2202, an image receiving portion 2203, operation switches 2204, and a display portion 2205. The present invention can be applied to the display portion 2205 or other signal controlling circuits.

Figure 14D:
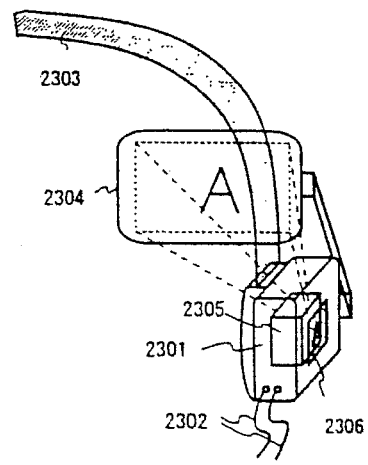

FIG. 14D is part of a head mounted type display (right-handed), and it includes a main body 2301, a signal cable 2302, a head fixation band 2303, a display portion 2304, an optical system 2305 and the display device 2306, etc. The present invention can be applied to the display device 2306.

Figure 14E:
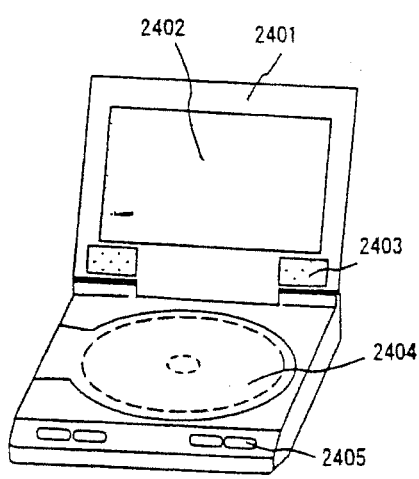

FIG. 14E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402 or other driver circuits.

Figure 14F:
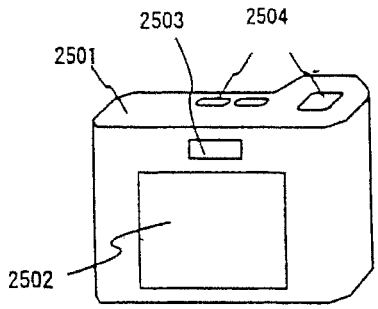

FIG. 14F is a digital camera, and it includes a main body 2501, a display portion 2502, an eyepiece portion 2503, operation switches 2504, and an image receiving portion (not shown in the figure), etc. The present invention can be applied to the display portion 2502 or other driver circuits.

Figure 15A:
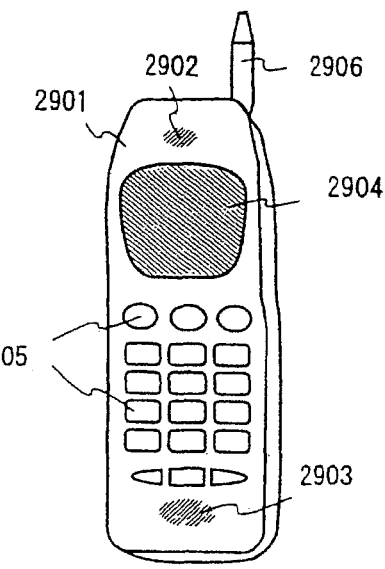
FIGS. 15A to 15C are diagrams showing examples of electronic equipment (Embodiment 9)

FIG. 15A is a portable telephone, and it includes a main body 2901, an audio output portion 2902, an audio input portion 2903, a display portion 2904, operation switches 2905, and an antenna 2906, etc. The present invention can be applied to the display portion 2904 or other driver circuits.

Figure 15B:
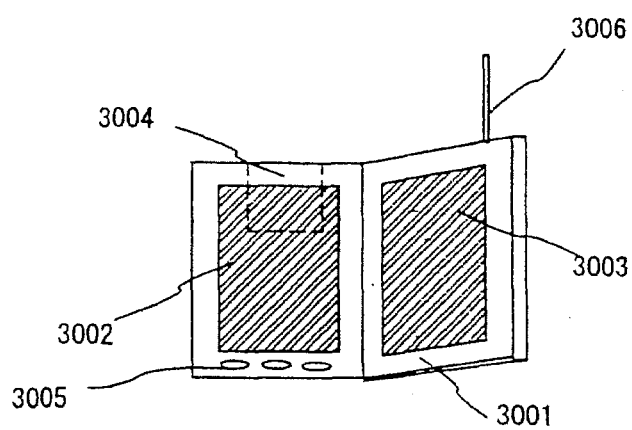

FIG. 15B is a portable book (electronic book), and it includes a main body 3001, display portions 3002 and 3003, a recording medium 3004, operation switches 3005, and an antenna 3006, etc. The present invention can be applied to the display portions 3002 and 3003 or other driver circuits.

Figure 15C:
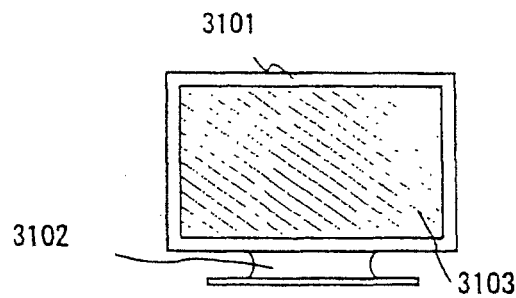

FIG. 15C is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic apparatuses in all fields. Further, the electronic apparatuses of this embodiment can be realized by using a constitution of any combination of embodiments 1 to 8.

Embodiment 10

The first etching process which forms the first shape conductive layers is performed under the condition that the first etching process is conducted once in Embodiment 1, but etching under the condition that the first etching process is conducted twice or more may also be performed in order to prevent thinning of the insulating film and increase the uniformity of its shape. An example of forming a first shape conductive layer by performing the first etching process under the condition that the first etching process is conducted twice is shown in Embodiment 10.

Further, a tapered shape is formed on both sides of a gate electrode and LDD regions are formed on both sides of a channel forming region in the present invention. Embodiment 10 is explained with reference to FIGS. 16A to 16D which show enlarged cross sectional views of one side of the device in the vicinity of a gate electrode in the process of manufacturing. Note that, for simplification, a base film and a substrate are not shown in the figures.

First, the same state as that of FIG. 2A is obtained in accordance with Embodiment 1. However, although a Ta film is used in Embodiment 1 as the first conductive film, a TaN film, having extremely high thermal resistance, is used in Embodiment 10 as the first conductive film. The first conductive film may have a film thickness of 20 to 100 nm, and a second conductive film may have a film thickness of 100 to 400 nm. A lamination is formed from the first conductive film, made from a TaN film having a film thickness of 30 nm, and the second conductive film, made from a W film having a film thickness of 370 nm, in Embodiment 10.

A first shape mask 1205a is formed next from resist, and etching, is performed by an ICP method, forming a first shape second conductive layer 1204. A mixed gas of $CF_4$, $Cl_2$, and $O_2$ is used as an etching gas having high selectivity with respect to TaN is used here, and the state shown in FIG. 16A can therefore be obtained. Various etching conditions, etching rates of the second conductive layer (W), etching rates of the first conductive layer (TaN), and the relationship to a taper angle of the second conductive layer (W) are shown in Table 1.

TABLE 1

| | ICP [W] | BIAS [W] | Pressure [Pa] | $CF_4$ [sccm] | Cl2 [sccm] | O2 [sccm] | W E.R. [nm/min] | TaN E.R. [nm/min] | W/TaN 選択比 | W taper angle [deg] |
|---|---|---|---|---|---|---|---|---|---|---|
| 1 | 500 | 20 | 1.0 | 30 | 30 | 0 | 58.97 | 66.43 | 0.889 | 80 |
| 2 | 500 | 60 | 1.0 | 30 | 30 | 0 | 88.71 | 118.46 | 0.750 | 25 |
| 3 | 500 | 100 | 1.0 | 30 | 30 | 0 | 111.66 | 168.03 | 0.667 | 18 |
| 4 | 500 | 20 | 1.0 | 25 | 25 | 10 | 124.62 | 20.67 | 6.049 | 70 |
| 5 | 500 | 60 | 1.0 | 25 | 25 | 10 | 161.72 | 35.81 | 4.528 | 35 |
| 6 | 500 | 100 | 1.0 | 25 | 25 | 10 | 176.90 | 56.32 | 3.008 | 32 |
| 7 | 500 | 150 | 1.0 | 25 | 25 | 10 | 200.39 | 80.32 | 2.495 | 26 |
| 8 | 500 | 200 | 1.0 | 25 | 25 | 10 | 218.20 | 102.87 | 2.124 | 22 |
| 9 | 500 | 250 | 1.0 | 25 | 25 | 10 | 232.12 | 124.97 | 1.860 | 19 |
| 10 | 500 | 20 | 1.0 | 20 | 20 | 20 | — | 14.83 | — | — |
| 11 | 500 | 60 | 1.0 | 20 | 20 | 20 | 193.02 | 14.23 | 13.695 | 37 |
| 12 | 500 | 100 | 1.0 | 20 | 20 | 20 | 235.27 | 21.81 | 10.856 | 29 |
| 13 | 500 | 150 | 1.0 | 20 | 20 | 20 | 276.74 | 38.61 | 7.219 | 26 |
| 14 | 500 | 200 | 1.0 | 20 | 20 | 20 | 290.10 | 45.30 | 6.422 | 24 |
| 15 | 500 | 250 | 1.0 | 20 | 20 | 20 | 304.34 | 50.25 | 6.091 | 22 |

Note that the term taper angle indicates the angle formed by a side surface of a material layer and the horizontal plane throughout this specification, as shown in the upper right diagram of FIG. 16A.

Furthermore, an angle formed by a side surface of the second conductive layer (W) and the horizontal plane (a taper angle α1) can be freely set in a range from 19° to 70° by setting any one of the first etching conditions 4 to 15 of Table 1, for example. Note that the etching time may be suitably determined by the operator.

Further, in FIG. 16A, reference numeral 1201 denotes a semiconductor layer, reference numeral 1202 denotes an insulating film, and reference numeral 1203 denotes a first conductive film.

Next, etching is performed under a second etching conditions with the mask 1205a left in place, forming a first shape first conductive layer 1203a. Note that, when etching under the second etching conditions, the insulating film 1202 is also etched somewhat, becoming a first shape insulating film 1202a. A mixed gas made from $CF_4$ and $Cl_2$ is used here as an etching gas for the Second etching conditions. Any one of the conditions 1 to 3 of Table 1 may be used as the second etching conditions, for example. By thus performing the first etching process under the condition that the first etching process is conducted twice, thinning of the insulating film 1202 can be suppressed.

A first doping process is performed next. An impurity element which imparts one conductivity to a semiconductor is added to the semiconductor layer 1201 with the first shape first conductive layer 1203a and the first shape second conductive layer 1204a as masks. Phosphorous, which imparts n-type conductivity, is added using ion doping here. (See FIG. 16B.) Note that, the first shape second conductive layer 1204a is also etched slightly when performing etching under the second etching conditions, but the amount is microscopic, and therefore a shape which is identical to that of FIG. 16A is shown in FIG. 16B.

A second etching process is performed next with the mask 1205a left in place, and the state shown in FIG. 16C is obtained. The following is performed as the second etching process in Embodiment 10: after performing etching under the first etching conditions using a mixed gas of $CF_4$ and $Cl_2$, additional etching is performed under the second etching conditions using a mixed gas of $CF_4$, $Cl_2$, and $O_2$. Regarding the etching conditions, the etching time may be suitably set using any one of the conditions within Table 1. Further, the width of each conductive layer in the longitudinal direction of the channel can be freely determined in accordance with the etching conditions. A second shape mask 1205b, a second shape first conductive layer 1203b, a second shape second conductive layer 1204b, and a second shape insulating film 1202b are formed by the second etching process.

The second shape second conductive layer 1204b forms a taper angle α2 which is larger than the taper angle α1 and the second shape first conductive layer 1203b forms an extremely small taper angle β. Further, a taper angle γ is also formed in portions of the second shape insulating film.

Next, after removing the mask 1205b, a second doping process is performed. (See FIG. 16D.) The concentration in the second doping process is lower than that of the first doping process. Phosphorous, which imparts n-type conductivity, is added to the semiconductor layer 1201 by using ion doping here, with the second shape second conductive layer 1204b as a mask.

Impurity regions 1201a to 1201c are formed by the second doping process. Further, the semiconductor layer which overlaps with the second conductive layer, sandwiching the insulating film and the first conductive layer, becomes a channel forming region. Note that, although not shown in the figures, the impurity regions 1201a to 1201c are on both sides of the channel forming region, so that they are symmetrical with respect to the channel forming region.

Further, the thicker the film thickness of the material layer positioned on the semiconductor layer, the shallower the depth at which ions will be injected in the doping process. Therefore, the impurity region 1201c which overlaps with the first conductive layer, sandwiching the insulating film, namely a third impurity region (GOLD region) is influenced by the tapered portion on the side face of the taper angle β, and the concentration of the impurity element added within the semiconductor layer changes. The thicker the film thickness, the lower the impurity concentration, and the thinner the film, the higher the impurity concentration.

The impurity region 1201b, namely a second impurity region (LDD region), is influenced by the film thickness of the second shape insulating film 1202b, and the concentration of the impurity element added within the semiconductor layer changes. In other words, the second impurity region is influenced by the tapered portion having the side face of the taper angle γ, and the concentration of the impurity element added within the semiconductor layer changes. Note that the impurity region 1201b which does not overlap with the first conductive layer has a higher concentration than the impurity region 1201c. Furthermore, the width of the impurity region 1201b in the longitudinal direction of the channel is on the same order as the impurity region 1201c, or is wider than the impurity region 1201c.

The impurity region 1201a, namely a first impurity region, becomes a high concentration impurity region with the impurity element added in the second doping process in addition to the impurity element added in the first doping process. The first impurity region functions as a source region or a drain region.

Subsequent processes are performed in accordance with the processes of Embodiment 1 from FIG. 3B onward to manufacture an active matrix substrate.

TFTs of a pixel portion and TFTs of a driver circuit are formed in accordance with the above stated method.

Further, Embodiment 10 can be freely combined with any one of Embodiments 1 to 3 and 6 to 9.

In addition, the selectivity with respect to the insulating film 1202 is extremely high for a case of using a mixed gas of $SF_6$ and $Cl_2$ as a substitute for the etching gas (the mixed gas of $CF_4$ and $Cl_2$) of Embodiment 10, or for a case of using a mixed gas of $SF_6$, $Cl_2$, and $O_2$ as a substitute for the mixed gas of $CF_4$, $Cl_2$, and $O_2$, and therefore thinning of the film can be additionally suppressed.

A reflecting type display device having a pixel structure in which a high aperture ratio is realized can be achieved in accordance with the present invention without increasing the number of masks or the number of process steps.

What is claimed is:

1. A display device comprising:
    a gate wiring, a source wiring, and a pixel electrode over a first substrate;
    a red color filter, a green color filter, and a blue color filter over a second substrate; and
    a liquid crystal and a spacer between the first substrate and the second substrate,
    wherein the pixel electrode includes a portion overlapped with the gate wiring, and a portion overlapped with the source wiring,
    wherein the spacer includes a portion where the red color filter, the green color filter, and the blue color filter are overlapped with each other, and
    wherein the blue color filter is interposed between the red color filter and the green color filter.

2. The display device according to claim 1, further comprising an overcoat layer comprising resin over the red color filter, the green color filter, and the blue color filter.

3. The display device according to claim 1, wherein the spacer has a thickness of 2 to 7 μm.

4. The display device according to claim 1, wherein the display device is incorporated in one selected from the group consisting of a personal computer, a video camera, a portable information terminal, a digital camera, a digital video disk player, and an electronic amusement device.

5. A display device comprising:
- a gate wiring, a source wiring, a capacitor wiring, and a pixel electrode over a first substrate;
- a red color filter, a green color filter, and a blue color filter over a second substrate; and
- a liquid crystal and a spacer between the first substrate and the second substrate,
- wherein the pixel electrode includes a portion overlapped with the gate wiring, a portion overlapped with the source wiring, and a portion overlapped with the capacitor wiring,
- wherein the spacer includes a portion where the red color filter, the green color filter, and the blue color filter are overlapped with each other, and
- wherein the blue color filter is interposed between the red color filter and the green color filter.

6. The display device according to claim 5, wherein the capacitor wiring extends in parallel with the gate wiring.

7. The display device according to claim 5, further comprising an overcoat layer comprising resin over the red color filter, the green color filter, and the blue color filter.

8. The display device according to claim 5, wherein the spacer has a thickness of 2 to 7 μm.

9. The display device according to claim 5, wherein the display device is incorporated in one selected from the group consisting of a personal computer, a video camera, a portable information terminal, a digital camera, a digital video disk player, and an electronic amusement device.

\* \* \* \* \*